(12) United States Patent
Uchida et al.

(10) Patent No.: US 11,108,070 B2
(45) Date of Patent: Aug. 31, 2021

(54) METHOD AND APPARATUS FOR FORMING ELECTRODE CATALYST LAYER BY ELECTROSPRAY METHOD

(71) Applicant: UNIVERSITY OF YAMANASHI, Kofu (JP)

(72) Inventors: Makoto Uchida, Kofu (JP); Katsuyoshi Kakinuma, Kofu (JP)

(73) Assignee: UNIVERSITY OF YAMANASHI, Kofu (JP)

(*) Notice: Subject to any disclaimer, the term of this patent is extended or adjusted under 35 U.S.C. 154(b) by 125 days.

(21) Appl. No.: 16/515,973

(22) Filed: Jul. 18, 2019

(65) Prior Publication Data
US 2019/0341639 A1 Nov. 7, 2019

Related U.S. Application Data

(63) Continuation of application No. PCT/JP2018/001540, filed on Jan. 19, 2018.

(30) Foreign Application Priority Data

Jan. 23, 2017 (JP) ................................ 2017-009373

(51) Int. Cl.
*H01M 8/1004* (2016.01)
*C23C 16/02* (2006.01)
(Continued)

(52) U.S. Cl.
CPC ....... *H01M 8/1004* (2013.01); *C23C 16/0263* (2013.01); *H01M 4/8825* (2013.01); *H01M 4/921* (2013.01)

(58) Field of Classification Search
CPC ... H01M 8/1004; H01M 4/8825; H01M 4/921
See application file for complete search history.

(56) References Cited

U.S. PATENT DOCUMENTS

2010/0102026 A1 4/2010 Lee et al.
2011/0017134 A1 1/2011 Tanioka et al.
(Continued)

FOREIGN PATENT DOCUMENTS

JP    WO2009/060898 A1    5/2009
JP       2010086730    *   4/2010
(Continued)

OTHER PUBLICATIONS

Yun Wang, Ken S. Chen, Jeffrey Mishler, Sung Chan Cho, Xavier Cordobes Adroher "A review of polymer electrolyte membrane fuel cells: Technology, applications, and needs on fundamental research" Applied Energy,vol. 88, Issue 4, Apr. 2011, pp. 981-1007.
(Continued)

*Primary Examiner* — Olatunji A Godo
(74) *Attorney, Agent, or Firm* — McGinn I.P. Law Group, PLLC.

(57) ABSTRACT

A method for forming an electrode catalyst layer by putting catalyst ink within an insulative container having a conductive nozzle in communication with the interior of the container and applying an electrospray voltage to the nozzle to cause electrospray of the catalyst ink through the tip end of the nozzle and thereby to form an electrode catalyst layer, the method includes preparing catalyst ink containing a mixture of at least electrode catalyst, polymer electrolyte binder and volatile organic compound and/or water, putting the catalyst ink within the container with a space remaining inside thereof and air-tightly sealing the container, and electrospraying with the space inside of the air-tightly sealed container being conditioned to have a negative pressure of a level at which the catalyst ink cannot drip off from the nozzle.

20 Claims, 13 Drawing Sheets

(51) Int. Cl.
*H01M 4/88* (2006.01)
*H01M 4/92* (2006.01)

(56) References Cited

U.S. PATENT DOCUMENTS

| | | | | |
|---|---|---|---|---|
| 2013/0323434 | A1* | 12/2013 | Boulfrad | B41J 3/28 427/555 |
| 2014/0120457 | A1* | 5/2014 | Choi | H01M 4/8832 429/534 |
| 2014/0356752 | A1* | 12/2014 | Correa | B01J 8/003 429/457 |

FOREIGN PATENT DOCUMENTS

| | | |
|---|---|---|
| JP | 2010-108894 A | 5/2010 |
| JP | 2016-198756 A | 12/2016 |

OTHER PUBLICATIONS

Wei Yuan, Yong Tang, Xiaojun Yang, Zhenping Wan "Porous metal materials for polymer electrolyte membrane fuel cells—A review" Applied Energy, vol. 94, Jun. 2012, pp. 309-329.

Elliot Martin, Susan A. Shaheen, Timothy E. Lipman, Jeffrey R. Lidicker "Behavioral response to hydrogen fuel cell vehicles and refueling: Results of California drive clinics" International Journal of Hydrogen Energy, vol. 34, Issue 20, Oct. 2009, pp. 8670-8680.

Kento Takahashi, Katsuyoshi Kakinuma, and Makoto Uchida "Improvement of Cell Performance in Low-PT-Loading PEFC Cathode Catalyst Layers Prepared by the Electrospray Method" Journal of the Electrochemical Society 163(10)F1182-F1188 (Aug. 17, 2016).

M. Brodt, T. Han, N. Dale, E. Niangar, R. Wycisk, and P. Pintauro, "Fabrication, In-Situ Performance, and Durability of Nanofiber Fuel Cell Electrodes" J. Electrochem. Soc., 162(1), F84-F91 (2015).

A.M. Chaparro, P. Ferreira-Aparicio, M.A. Folgado, E. Brightman, G. Hinds"Study of superhydrophobic electrosprayed catalyst layers using a localized reference electrode technique" Journal of Power Sources, vol. 325, Sep. 1, 2016, pp. 609-619.

International Search Report (ISR) (PCT Form PCT/ISA/210), in PCT/JP2018/001540, dated Apr. 17, 2018 (English Version).

Written Opinion of the International Search Authority (WOSA) (PCT Form PCT/ISA/237), in PCT/JP2018/001540, dated Apr. 17, 2018 (Japanese Version).

S. Martin et al., "High platinum utilization in ultra-low Pt loaded PEM fuel cell cathodes prepared by electrospraying", International Journal of Hydrogen Energy, 2010, 35, pp. 10446-10451.

S. Martin et al., "Peak utilization of catalyst with ultra-low Pt loaded fuel cell electrodes prepared by the electrosprayed method", Journal of Power Sources, 2013, 229, pp. 179-184.

S. Martin et al., "Electrospray deposition of catalyst layers with ultra-low Pt loadings for PEM fuel cell cathodes", Journal of Power Sources, 2010, 195, pp. 2443-2449.

R. Benitez et al., "Novel method for preparation of PEMFC electrodes by the electrospray technique", Journal of Power Sources, 2005, 151, pp. 108-133.

\* cited by examiner

METHOD AND APPARATUS FOR FORMING ELECTRODE CATALYST LAYER BY ELECTROSPRAY METHOD

TECHNICAL FIELD

The present invention relates to a method and apparatus for forming (or preparing or fabricating) an electrode catalyst layer used for, for example, a solid type polymer electrolyte fuel cell (PEFC) and water electrolysis, by an electrospray (ES) method or an electrospray deposition method.

BACKGROUND ART

One of the priority items in the development of fuel cells and water electrolysis has been requiring reduction in the amount of use of platinum (Pt), which is one of precious electrode catalysts. While the reduction in the amount of use of Pt has been active from the standpoint of materials chemistry, researches and developments from the standpoint of practical processes for electrode catalyst layer preparation are currently less focused on.

Processes for forming (coating) an electrode catalyst layer on a polymer electrolyte membrane include screen print (screen printing) methods, doctor blade (coating) methods, squeegee methods, spray (printing, applying, coating) methods, and bar-coater methods, which cannot be a direct solution to the reduction in the amount of use of Pt, coating the entire surface of electrode catalyst particles with a polymer electrolyte membrane, and/or the like.

Studies focused on the electrospray (ES) method or the electrospray (ES) deposition method as a highly potential method of forming an electrode catalyst layer have been carried out and reported as in Non-Patent Documents 1 to 3 below. These reports, however, only provide less specific descriptions, and studies on the formation of an electrode catalyst layer by the electrospray (ES) method is just get started.

The inventors have formed an electrode catalyst layer using the electrospray method, as described in Non-Patent Document 4, to allow for significant reduction in the amount of use of Pt. The present invention has been made to basically further improve the electrospray method in Non-Patent Document 4, as will be described below.

PRIOR ART DOCUMENTS

Non-Patent Documents

Non-Patent Document 1: Yun Wang, Ken S. Chen, Jeffrey Mishler, Sung Chan Cho, Xavier Cordobes Adroher "A review of polymer electrolyte membrane fuel cells: Technology, applications, and needs on fundamental research" Applied Energy, Volume 88, Issue 4, April 2011, Pages 981-1007

Non-Patent Document 2: Wei Yuan, Yong Tang, Xiaojun Yang, Zhenping Wan "Porous metal materials for polymer electrolyte membrane fuel cells-A review" Applied Energy, Volume 94, June 2012, Pages 309-329

Non-Patent Document 3: Elliot Martin, Susan A. Shaheen, Timothy E. Lipman, Jeffrey R. Lidicker "Behavioral response to hydrogen fuel cell vehicles and refueling: Results of California drive clinics" International Journal of Hydrogen Energy, Volume 34, Issue 20, October 2009, Pages 8670-8680

Non-Patent Document 4: Kento Takahashi, Katsuyoshi Kakinuma, and Makoto Uchida "Improvement of Cell Performance in Low-Pt-Loading PEFC Cathode Catalyst Layers Prepared by the Electrospray Method" Journal of The Electrochemical Society, 163(10)F1182-F1188 (Aug. 17, 2016)

SUMMARY OF THE INVENTION

It is namely an object of the present invention to improve the electrospray (ES) method from the standpoint of, for example, electrode catalyst and/or catalyst ink used, electrode catalyst layer structure, power generation performance, and water electrolysis performance.

In particular, the present invention provides a wider range of selection of electrode catalysts usable in the electrospray (ES) method.

More specifically, the present invention provides a method and apparatus for forming an electrode catalyst layer by electrospray capable of using even low-viscosity catalyst ink.

The present invention further provides a method and apparatus more easily controllable, capable of forming a more even electrode catalyst layer, and further capable of saving catalyst ink.

The present invention still further provides a method and apparatus suitable for forming an electrode catalyst layer that uses a reduced amount of precious catalytic metal such as Pt and has a structure in which the surface of electrode catalyst particles is coated approximately entirely with polymer electrolyte binder.

A method for forming an electrode catalyst layer by an electrospray method according to the present invention includes putting catalyst ink containing a mixture of at least electrode catalyst, polymer electrolyte binder and volatile organic compound and/or water within an insulative container with a space remaining inside of the container, and air-tightly sealing the container and, with the space inside of the air-tightly sealed container being conditioned to have a negative pressure of a level at which the catalyst ink cannot drip off from a conductive nozzle in communication with the interior of the container, applying an electrospray voltage to the nozzle to cause electrospray of the catalyst ink through the tip end of the nozzle and thereby to form an electrode catalyst layer. The space inside of the air-tightly sealed container contains air and/or other types of gas, which can be used to adjust the pressure (negative pressure) within the space inside of the air-tightly sealed container.

The electrode catalyst contained in the catalyst ink includes homogeneous catalyst as the catalyst itself and heterogeneous catalyst consisting of catalyst and support supporting the catalyst. The polymer electrolyte binder contained in the catalyst ink has proton (electrical) conductivity and intended to thinly coat the surface of the electrode catalyst. The medium as a mixture of a non-aqueous medium representative of volatile organic compound (alcohols, aldehydes) and water is a dispersive medium in which the electrode catalyst is dispersed, and used to adjust the viscosity of the catalyst ink. The dispersive medium may only contain a non-aqueous medium (volatile organic compound) or water (i.e. at least one of volatile organic compound (non-aqueous medium) and water). The expression of volatile organic compound (non-aqueous medium) and/or water includes all of the aspects.

The catalyst ink contains conductive material, as described above, to show electrical conductivity. Accordingly, applying an electrospray voltage to the nozzle is equivalent to applying an electrospray voltage to the catalyst ink, as described in Non-Patent Document 4. Given the related art described in Non-Patent Document 4, the present invention can be defined as follows. That is, the present invention is directed to a method for forming an electrode catalyst layer by putting catalyst ink within a container having a nozzle in communication with at least a lower portion of the interior of the container and applying an electrospray voltage to the nozzle or the catalyst ink to cause electrospray of the catalyst ink through the tip end of the nozzle, the method including preparing catalyst ink containing a mixture of at least electrode catalyst, polymer electrolyte binder and volatile organic compound and/or water, putting the catalyst ink within the container with a space remaining inside thereof and air-tightly sealing the container, and electrospraying with the space inside of the air-tightly sealed container being conditioned to have a negative pressure of a level at which the catalyst ink cannot drip off from the nozzle. The space contains therein air or other types of gas for conditioning to have a negative pressure as described above.

When the catalyst ink is put in the container and an electrospray generating voltage is applied (the polarity of the applied voltage depends on the catalyst) to the conductive nozzle in communication with the container or the catalyst ink and the polymer electrolyte membrane (or the support substrate (holding member) thereof) to be formed with the electrode catalyst layer, the catalyst ink is sprayed through the tip end of the nozzle. The mist of the sprayed catalyst ink is miniaturized by electrostatic repulsion to be deposited on the polymer electrolyte membrane. The nozzle is only required to have at least a conductive tip end portion or may be insulative. The container also can have an insulative or conductive aspect.

Even when the catalyst ink may have low viscosity to drip off from the tip end of the conductive nozzle mounted to the container, when the space inside of the container not occupied by the catalyst ink has the atmospheric pressure, it is possible to inhibit the catalyst ink from dripping off due to its own weight by conditioning the space inside of the container not occupied by the catalyst ink to have a negative pressure. While the level of the negative pressure depends on the inner diameter of the conductive nozzle and/or the viscosity of the catalyst ink, a negatively pressurized state is preferred just when the dripping through the tip end in the lower portion of the conductive nozzle is stopped by conditioning or controlling the negative pressure of the space inside of the container not occupied by the catalyst ink starting from the state where the catalyst ink drips off from the conductive nozzle. Upon this, the state is of a level at which meniscus is formed by the surface of the catalyst ink at the tip end in the lower portion of the conductive nozzle. It will be appreciated that the space not occupied by the catalyst ink is only required to have a negative pressure within a tolerance thereof.

That is, in a preferred aspect, the negative pressure within the space inside of the air-tightly sealed container may be adjusted according to the viscosity of the catalyst ink. In an implementation, the negative pressure within the space inside of the air-tightly sealed container is within the range from 0 to 0.47 kPa (excluding 0 kPa). In a preferred implementation, the negative pressure within the space inside of the air-tightly sealed container is within the range from 0.05 to 0.4 kPa.

According to the electrospray (ES) method, the fine mist of the catalyst ink is deposited, whereby the electrode catalyst layer can have an even and required thickness and it is possible to reduce the amount of use of Pt and/or Pt alloy, which are precious catalysts. Since the volatile organic compound and/or water is volatilized and the fine mist is dried within the space immediately after electrospraying, this also exhibits an advantageous effect of requiring no or only short-lasting post-process drying. Further, since the volatile organic compound and/or water in the catalyst ink is volatilized immediately, the polymer electrolyte binder dispersed in the catalyst ink is also inhibited from aggregating and thereby coats approximately the entire surface of the electrode catalyst evenly, resulting in an increase in the performance of a fuel cell or water electrolysis using such a catalyst layer.

In particular, the present invention can employ even low-viscosity catalyst ink and thereby provides a wider range of selection of electrode catalysts.

While the nozzle is only required to point downward below the horizon, in a preferred embodiment, the nozzle is provided in a lower portion of the container and the tip end of the nozzle points downward. A film-like medium (film-like base) to be formed on the surface thereof with the electrode catalyst layer is also arranged below the nozzle. The film-like medium includes an electrode base material such as a polymer electrolyte membrane or a gas diffusion layer or a base material used for transcription. A substrate is preferably provided on which a polymer electrolyte membrane or the like is placed.

In a preferred embodiment, the nozzle is further supported in a manner movable up and down and fixable in a desired position. The nozzle and the polymer electrolyte membrane to be formed with the electrode catalyst layer can be scanned relatively and two-dimensionally within at least a range of the area of the polymer electrolyte membrane to form the electrode catalyst layer evenly across the polymer electrolyte membrane or the like (film-like medium; hereinafter referred to as "polymer electrolyte membrane or the like").

It will be appreciated that the pressure within the space inside of the container not occupied by the catalyst ink (the pressure of gas within the space) may be measured.

In a preferred embodiment, a conductive gate plate with a control hole opened with the center on an extension of the nozzle is arranged between the nozzle and the polymer electrolyte membrane or the like to be formed on the surface thereof with the electrode catalyst layer. During the scanning, the nozzle and the gate plate are moved together with the arrangement relationship therebetween maintained. The gate plate is applied with a voltage of a polarity opposite to that for the nozzle (including ground level).

The fine mist of the catalyst ink sprayed through the nozzle is inhibited from spreading by the control hole in the gate plate and, through the control hole, deposited on the polymer electrolyte membrane or the like. This allows the range of deposition of the catalyst ink to be limited and thereby an unnecessary electrode catalyst layer not to be formed, and also the scanning to be controlled easily, and further the evenness of the deposited electrode catalyst layer to be increased.

The present invention also provides an apparatus for forming an electrode catalyst layer by an electrospray method, the apparatus used for performing the above-described method. The apparatus includes a retaining mechanism for retaining an air-tightly sealable container within which catalyst ink is put with a space filled with gas remaining inside thereof and a nozzle in communication with the interior of the container, a medium holding member arranged on an extension of the nozzle retained by the retaining mechanism and holding on the surface thereof a polymer electrolyte membrane or the like (film-like base) to be formed with an electrode catalyst layer, pressure measuring means for measuring the pressure within the space inside of the container retained by the retaining mechanism, pressure adjusting means for conditioning the space inside of the container retained by the retaining mechanism to have a negative pressure, and a voltage-adjustable high-voltage generator for applying an electrospray voltage between the catalyst ink within the container or the nozzle and the polymer electrolyte membrane or the like or the medium holding member. The space inside of the container contains air or other types of gas.

In a preferred embodiment, a conductive gate plate with a control hole opened with the center on an extension of the nozzle is arranged between the nozzle and the medium holding member. The potential of the conductive gate plate is preferably equal to that of the medium holding member (at least the portion on which the polymer electrolyte membrane or the like is held is conductive) or the polymer electrolyte membrane or the like, though may be a slight potential difference therebetween.

The retaining mechanism also preferably retains the container in a positionable manner.

A gate plate retaining mechanism for retaining the gate plate in a positionable manner is further preferably provided.

In a preferred embodiment, a scanning mechanism for translating (moving in parallel) the retaining mechanism relatively to the medium holding member is provided.

The scanning mechanism is preferably arranged to translate (move in parallel) the retaining mechanism and the gate plate retaining mechanism relatively to the medium holding member.

MODES FOR CARRYING OUT THE INVENTION (1) Apparatus for Forming Electrode Catalyst Layer by Electrospray (ES) Method.

Figure 1:
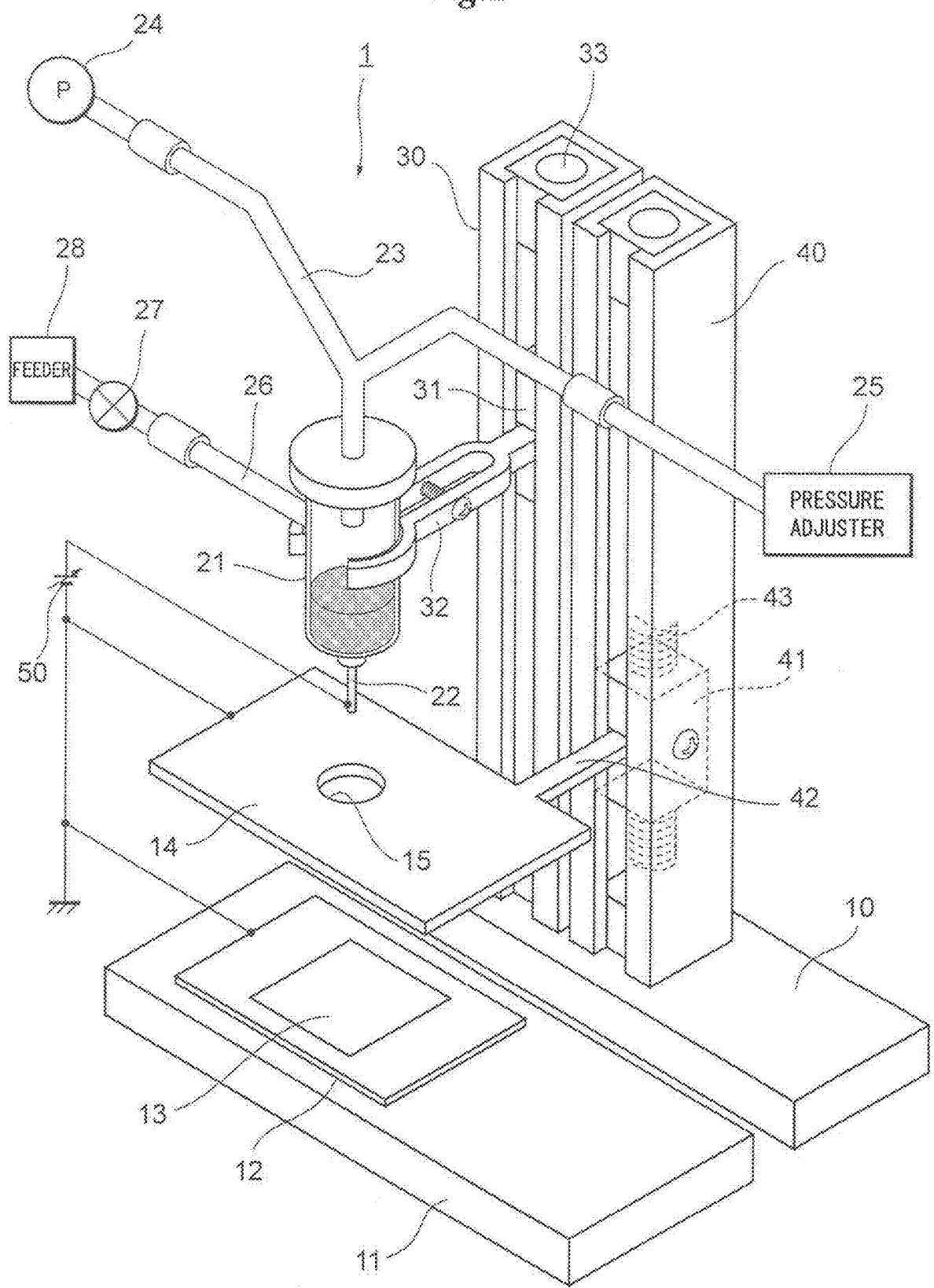
FIG. 1 is a perspective view showing an apparatus for forming an electrode catalyst layer by an electrospray (ES) method.

FIG. 1 shows an example schematic construction of an apparatus 1 for forming (fabricating) an electrode catalyst layer by an electrospray (ES) method. As shown, X axis (left-and-right direction) and Y axis (depth direction, front and rear) are set in a manner orthogonal to each other on a horizontal plane, while Z axis (up-and-down direction) is set vertically upward.

An XY table 11 is provided on the front side, while an X table (X-direction table) 10 is provided on the deeper (rear) side. The XY table 11 is arranged to move a metal substrate 12 placed thereon in the X and Y directions. In this example, only the movement in the Y direction will be employed for scanning, as will be described below. The X table 10 is arranged to move, together in the X direction, two posts (pillar, pole, column) 30 and 40 provided (fixed) thereon in a manner arranged in the X direction and standing vertically. A fixed simple base may be provided instead of the X-direction table and XY-direction scanning is achieved by the XY table 11, or the X table may be replaced with an XY table to thereby achieve XY scanning.

The interior of the post 30 is a hollow guide path, within which a liftable body (vertically movable) 31 is provided in a liftable manner. The liftable body 31 cannot move rotationally or horizontally, but only vertically. A female thread is formed internally to the liftable body 31, within which a threaded shaft 33 passes therethrough vertically and is fitted threadably to the female thread. The threaded shaft 33 is supported at upper and lower end portions thereof rotatably on the post 30. The threaded shaft 33 is not allowed to move vertically, but only rotationally. The threaded shaft 33 may be rotated by a rotary drive unit such as a motor or manually through a handle or the like provided (both not shown). When the threaded shaft 33 is rotated, the liftable body 31 moves up and down.

The post 40 has the same liftable (up-and-down) mechanism. That is, the interior of the post 40 is a hollow guide path, within which a liftable (vertically movable) body 41 is provided in a liftable manner. The liftable body 41 cannot move rotationally or horizontally, but only vertically. A female thread is formed internally to the liftable body 41, within which a threaded shaft 43 passes therethrough vertically and is fitted threadably to the female thread. The threaded shaft 43 is supported at upper and lower end portions thereof rotatably on the post 40. The threaded shaft 43 is not allowed to move vertically, but only rotationally. The threaded shaft 43 may be rotated by a rotary drive unit such as a motor or manually through a handle or the like provided (both not shown). When the threaded shaft 43 is rotated, the liftable body 41 moves up and down.

A clamping tool (grasping tool, holding tool) 32 is fixedly mounted to the liftable body 31 and extends forward (toward the XY table 11) through a slit formed vertically in the front face of the post 30. An ink reservoir container (container) 21 is held detachably on the clamping tool 32. The ink reservoir container 21 is made of an insulator and air-tightly sealable. A metal conductive nozzle 22 in communication with the interior of the ink reservoir container 21 is attached detachably to the underside of the ink reservoir container 21 and points (extends) vertically downward. Catalyst ink is put within the ink reservoir container 21 at a level at which a space exists in an upper portion of the interior of the ink reservoir container 21. The space contains air and/or other types of gas therein.

A Y-shaped pipe 23 in communication with the interior of the ink reservoir container 21 is attached to the top side (lid) of the ink reservoir container 21. A pressure gauge (manometer) 24 is connected to one branched pipe of the Y-shaped pipe 23, while a pressure adjuster (device) 25 capable of depressurizing the interior of the ink reservoir container 21 to have a negative pressure is connected to the other branched pipe. The pressure adjuster 25 may be something like a syringe for manual pressure adjustment or an automatically pressure-controllable device. The pressure gauge 24 and the pressure adjuster 25 may be mounted to the clamping tool 32 or the post 30. In this case, shorter piping would be enough. The piping is preferably rigid so as not to be deformed easily by a differential pressure. As needed, the ink reservoir container 21 is provided with a catalyst ink feed pipe 26, which is connected through a valve 27 to a catalyst ink feeder 28. A pressure setter may be provided in the pressure adjuster 25, to which a measured pressure by a pressure gauge 24 may be fed back, so that the pressure adjuster 25 can automatically adjust the pressure within the ink reservoir container 21.

An arm 42 is fixed to the liftable body 41 and extends forward through a slit formed vertically in the front face of the post 40, with the leading end thereof fixed with a metal gate plate 14. The gate plate 14 is horizontal with a through hole (control hole) (perforation) 15 opened with the center on an extension (vertically downward) of the conductive nozzle 22 that is attached to the ink reservoir container 21 held on the clamping tool 32.

The ink reservoir container 21 with the conductive nozzle and the gate plate 14 are arranged to be translated (move in parallel) together by the X-direction table 10.

During electrospraying, the conductive nozzle 22 is connected to the positive output terminal of a high-voltage generator 50, while the gate plate 14 and the metal (conductive) substrate (membrane holding member, medium holding member) 12 placed on the XY table 11 are each connected to the ground terminal of the high-voltage generator 50. The high-voltage generator 50 can adjust its output voltage value. A polymer electrolyte membrane (film-like medium) 13 to be applied (coated) with catalyst by electrospraying is also placed and fixed on the substrate 12. The conductive nozzle 22, the center of the hole 15, and the center of the polymer electrolyte membrane 13 may be aligned, and the conductive nozzle 22 and the gate plate 14 may be moved together in the XY direction (the conductive nozzle 22 always corresponds to the center of the hole 15) to scan the surface of the polymer electrolyte membrane 13 within the range thereof. The ink reservoir container 21 and the gate plate 14 may be adjusted in the height position by rotating the respective threaded shafts 33, 43 and fixed at any height position by a fixture such as a fixation screw.

(2) Electrode Catalyst

In this embodiment, inorganic particulates were employed having electron conductivity ($10^{-4}$ Scm$^{-1}$ or higher), a surface area of 15 m$^2$ g$^{-1}$ or more when evaluated by the Brunauer-Emmett-Teller (BET) adsorption method, and a beaded microstructure in which particles are partially fusion bonded, such particulates including ceramics such as oxides, carbides, and nitrides, and carbon particulates. Some inorganic particulates show catalytic action, including IrOx, RuOx. These inorganic particulates were defined as homogeneous catalyst. In case of inorganic particulates not showing marked catalytic action, it would be necessary to support Pt and/or Pt-containing alloy nanoparticles, which show catalytic action. Inorganic particulates supporting Pt and/or Pt-containing alloy nanoparticles (catalyst) were defined as heterogeneous catalyst, in which such inorganic particulates were defined as support. Inorganic particulates can be synthesized by a common method such as a liquid phase method or a gas phase method. Also, Pt and Pt-containing alloy nanoparticles can be synthesized by a common method such as a colloid method or a reverse micelle method.

While Ta-doped $SnO_2$ was employed as exemplary heterogeneous catalyst in this embodiment, elements such as Nb, Sb, having a valence of 5 or more, may be used instead of Ta, and $SnO_2$ may also be replaced with oxides, nitrides, or carbides for which an element having a valence of 5 or more is substituted and dissolved to show comparable performance. Also, alloy nanoparticles including Pt, precious metal, and/or Pt-containing metal element were supported at 10 wt % or more on the support, and the diameter of alloy nanoparticles including Pt and/or Pt-containing metal element was averaged within the range from 2 to 10 nm when evaluated using electron microscope images.

(3) Preparation of Supported Catalyst

Ta-doped $SnO_2$ (Ta—$SnO_2$) serving as support was synthesized by a flame method. Turpentine solutions of octylic acid-Sn and octylic acid-Ta were mixed to have a molar ratio (Sn/Ta) of 0.9 to 0.99 and stirred for 30 minutes using a magnetic stirrer to prepare a precursor mixed solution of Sn and Ta. Chemical flame by mixed gas of propane (1 L/min) and oxygen (5 L/min) was generated within a flame generator and sprayed with the precursor mixed solution at a rate of 3 g/min using a PERISTA pump and a spraying device to synthesize Ta—$SnO_2$. The synthesized Ta—$SnO_2$ was thermally processed in air at 800 degrees C. for 4 hours.

The surface area of Ta—$SnO_2$ in the case above was read 25.6 m$^2$ g$^{-1}$ by the BET adsorption method (using Belsorp Max from MicrotracBEL Corporation). The crystalline phase of Ta—$SnO_2$ immediately after the synthesis by the flame method and after the thermal process in air at 800 degrees C. for 4 hours was also identified, using an X-ray diffractometer (XRD, Ultima IV from Rigaku Corporation; CuKα-ray, tube voltage of 40 kV, tube current of 40 mA, with Ni filter, scanning range of 10 degrees≤2θ≤90 degrees), to be rutile single phase.

A colloid method was used to synthesize Pt nanoparticles and support on Ta—$SnO_2$. First, 0.57 mL of chloroplatinic acid solution was diluted with 38 mL of ultrapure water and added with 1.76 g of sodium sulfite as a reductant and then stirred to prepare platinum-containing solution. The platinum-containing solution was added with 150 mL of ultrapure water and dripped with 0.6 M sodium carbonate aqueous solution using a potential difference automatic titration device (AT-500 from Kyoto Electronics Manufacturing Co., Ltd.) to have an adjusted pH of 5. Further, the platinum-containing solution was dripped with 35% hydrogen peroxide solution at a rate of 2 mL·min$^{-1}$ while dripped with 1.3 M aqueous sodium hydroxide using a potential difference automatic titration device to maintain the platinum-containing solution at pH 5. Next, dispersion with 0.50 g of Ta—SnO$_2$ dispersed in 15 mL of ultrapure water was added to the platinum-containing solution dripped with 35% hydrogen peroxide solution to prepare mixed solution of Pt colloid and Ta—SnO$_2$. The mixed solution of Pt colloid and Ta—SnO$_2$ was heated to 90 degrees C. and stirred for 3 hours and then cooled to the room temperature and stirred overnight, and thereafter filtered and rinsed to synthesize Pt colloid-supported Ta—SnO$_2$ powder. It is noted that the rinsing operation was repeated until no white precipitate of silver chloride was detected after dripping of silver nitrate aqueous solution into the filtrate from each rinsing operation. The Pt colloid-supported Ta—SnO$_2$ powder was dried overnight at 80 degrees C. in a thermostatic bath.

After drying overnight at 80 degrees C. in the thermostatic bath, the Ta—SnO$_2$ powder was put in a tubular electric furnace (from Alpha Technical Research Corporation) with nitrogen gas flowing therein (at a flow rate of 100 mL·min$^{-1}$) to be thermally processed at 400 degrees C. for 30 minutes in the nitrogen gas atmosphere, and further the Pt colloid-supported Ta—SnO$_2$ powder was rapidly cooled to the room temperature while being kept in the nitrogen gas atmosphere. After rapid cooling to the room temperature, the electric furnace was turned to and kept in a nitrogen atmosphere for 2 hours or more. The powder obtained through a series of operations was evaluated and identified using an XRD to have a crystalline phase of only Pt and Ta—SnO$_2$ and also identified, using a transmission electron microscope (TEM, H-9500 from Hitachi High-Technologies Corporation; acceleration voltage of 200 kV), to be in high-dispersion support of Pt on Ta—SnO$_2$. It is noted that the particle diameter of Pt high-dispersion supported on Ta—SnO$_2$ was found from TEM images to be 5.05±0.71 nm. The amount of Pt supported on Ta—SnO$_2$ was also measured by an inductively coupled plasma mass spectrometer (ICP-MS, 7500CX from Agilent Technologies, Ltd.) and found to be 17.5 wt %. The finally obtained powder (heterogeneous catalyst) (supported catalyst) through the procedure above will hereinafter be referred to as Pt/Ta—SnO$_2$.

(4) Preparation of Catalyst Ink (Cathode Catalyst Ink)

Next, mixed solution (catalyst ink) of Pt/Ta—SnO$_2$, polymer electrolyte (ionomer) binder, volatile organic compound, and water was prepared. The polymer electrolyte binder is only required to have proton conductivity and a property of coating the catalyst surface at a thickness of a few nanometers, including, for example, Nafion (registered trademark), Flemion (trademark), Aquivion, each of which is a type of perfluorosulfonic acid, among which Nafion was employed in this example. The volatile organic compound is highly volatile at the room temperature, preferably having a capacity of dissolving the polymer electrolyte binder at 5 vol % or more. Specific examples include methanol, ethanol, propanol, butanol, and the like. In this example, 0.45 g of Pt/Ta—SnO$_2$ as catalyst was mixed with Nafion as polymer electrolyte binder at a ratio of 0.2 or 0.7 to the volume of Pt/Ta—SnO$_2$. That is, two types of catalyst ink were prepared at varying ratios of mixture of Pt/Ta—SnO$_2$ and Nafion. These two types of catalyst ink are distinguished using these ratios of mixture and will hereinafter be referred to as I/S=0.2 and I/S=0.7. For the mixture of Pt/Ta—SnO$_2$ of I/S=0.2 or I/S=0.7 and Nafion, 1.98 g of 2-propanol as a type of volatile organic compound, 2 g of water, and 20 zirconia balls (with a diameter of 5 mm) were put in a zirconia pot (from Fritsch Inc.; volume of 45 cm$^2$) and mixed for 30 minutes using a planet ball mill (P-6 from Fritsch Inc.; rotating speed of 270 rpm). The mixture thus obtained through mixing in the planet ball mill was mixed for additional 2 hours in a millpot rotary machine (ANZ-615 from Nitto Science Inc.; rotating speed of 60 rpm), and the thus obtained mixture was kept stationary for 24 hours in a refrigerator (at 12 degrees C.). After being kept stationary for 24 hours, the mixture was mixed for additional 1 hour in the millpot rotary machine and further redispersed in an ultrasonic homogenizer (UH-50 from SMT Co., Ltd.). The mixture of Pt/Ta—SnO$_2$ and Nafion obtained through a series of operations will hereinafter be referred to as cathode catalyst ink. Keeping the mixture stationary in the refrigerator allows for increase in the stability.

(5) Preparation of Catalyst Ink (Anode Catalyst Ink)

Mixed solution of Pt-supported carbon black (Pt/CB, TEC10E50E from Tanaka Kikinzoku Kogyo K.K.; Pt support amount of 46 wt %), Nafion, ethanol, and water was also prepared in a similar way as the preparation condition for the cathode catalyst ink. Specifically, 0.45 g of Pt/CB was mixed with Nafion at a ratio of 0.7 to the volume of Pt/Ta—SnO$_2$, 3.96 g of ethanol as a type of volatile organic compound, 2 g of water, and 20 zirconia balls (with a diameter of 5 mm) were put in a zirconia pot (from Fritsch Inc.; volume of 45 cm$^2$) and mixed for 30 minutes using a planet ball mill (P-6 from Fritsch Inc.; rotating speed of 270 rpm). The mixture thus obtained through mixing in the planet ball mill was mixed for additional 2 hours in a millpot rotary machine (ANZ-615 from Nitto Science Inc.; rotating speed of 60 rpm), and the thus obtained mixture was kept stationary for 24 hours in a refrigerator (at 12 degrees C.). After being kept stationary for 24 hours, the mixture was mixed for additional 12 hours in the millpot rotary machine and further redispersed in an ultrasonic homogenizer (UH-50 from SMT Co., Ltd.). The mixture of Pt/CB and Nafion obtained through a series of operations will hereinafter be referred to as anode catalyst ink.

(6) Formation of Cathode Catalyst Layer by Electrospray (ES) Deposition Method and Experimental Results The apparatus 10 for forming an electrode catalyst layer by an electrospray (ES) method described above with reference to FIG. 1 was used.

The metal (conductive) nozzle 22 (with an inner diameter of 210 μm as an example) was installed at the center of the bottom (portion) of the plastic ink reservoir 21 (with a volume of 10 cm$^3$) (insulative ink reservoir container) into which cathode catalyst ink is to be put. The distance between the tip end of the metal nozzle 22 and the substrate 12 was 2.5 cm, and the metal gate plate 14 was positioned 0.5 cm from the tip end of the metal nozzle 22 vertically downward from the metal nozzle. The metal gate plate 14 had a through hole 15 with a diameter of 1 cm and, immediately above the center of the through hole 15, the tip end of the metal nozzle 22 was positioned.

The manometer (pressure gauge) 24 capable of measuring the pressure (differential pressure) within the ink reservoir and the syringe (pressure adjuster, device) 25 capable of controlling the pressure within the ink reservoir were connected to the top side of the ink reservoir 21 via respective silicon tubes. The lid was provided so that the interior of the ink reservoir 21 can be air-tightly sealed during application (coating) of the catalyst ink. The internal pressure (negative pressure) of the ink reservoir was controlled to be within the range from 0.32 kPa to 0.38 kPa as a differential pressure to the atmospheric pressure. (This point will be described in detail later with reference to FIG. 5.)

The positive terminal of the direct-current high-voltage generator 50 (610E from Trec Japan Inc.) was connected to the metal nozzle 22, while the negative terminal of the high-voltage generator 50 was connected to the substrate 12 and the metal gate plate 14 and further grounded. The high-voltage generator 50 allowed for controlling the voltage between its positive and negative terminals to be 2.0 kV to 4.0 kV during electrospraying of the catalyst ink.

The substrate 12 can be moved 2 cm by the XY table 11 from the front side toward the deeper (rear) side of the drawing (in the Y direction), upon which the moving speed is 5 mm/sec. When the substrate 12 is moved 2 cm from the front side toward the deeper side of the drawing, the catalyst ink reservoir 21 can be moved leftward or rightward (in the X direction) at a pitch of 0.20 mm by the X-direction table 10 in conjunction (together) with the metal gate plate 14. Such a series of operations of the ink reservoir 21, the gate plate 14 and the substrate 12 allows the catalyst ink to be applied within the range of a square of 2 cm×2 cm. That is, the polymer electrolyte membrane (proton (electrically) conductive polymer membrane or ion exchange membrane) 13 is fixed to (or may be simply placed on or fixed, using adhesive tape or the like, to) the substrate 12, and the conductive nozzle 22 is arranged to deposit (form) the cathode catalyst ink by electrospraying on the surface of the polymer electrolyte membrane 13 at a constant pitch (0.2 mm) in the X direction while scanning relatively in the Y direction over the polymer electrolyte membrane 13. The presence of the hole 15 in the metal gate plate 14 causes the mist of the catalyst ink formed by electrospraying to be inhibited from spreading when passing through the hole 15 and thereby controlled to run straight downward from the conductive nozzle 22. This allows an electrode catalyst layer to be formed (coated, applied) at an even film thickness within a predetermined range.

Upon application of the catalyst ink, the conductive nozzle 22 is preliminarily moved in the X direction to be brought out of the area in which the polymer electrolyte membrane 13 exists. In this state, the catalyst ink is put in the ink reservoir 21 and the interior of the reservoir 21 is air-tightly sealed. Upon this, the space inside of the ink reservoir not occupied by the catalyst ink has the atmospheric pressure. The catalyst ink, if having low viscosity, drips off from the conductive nozzle 22. As the pressure adjuster 25 depressurizes the space inside of the ink reservoir 21 (to be in a negative pressure state), the negative pressure within the ink reservoir 21 prevents the catalyst ink from dripping due to its weight. At the moment when the dripping of the catalyst ink is stopped, the surface of the catalyst ink is in a state formed with a meniscus at the tip end of the conductive nozzle 22. Starting electrospraying in this state and confirming that a stable cone-jet mode to be discussed next is achieved, the conductive nozzle 22 is moved relatively over the polymer electrolyte membrane 13 for scanning as described above.

In practice, for application of the catalyst ink, the ink reservoir 21 was fed with 1 cm$^3$ of cathode catalyst ink and air-tightly sealed with the lid, and a predetermined voltage was applied between the conductive nozzle 22 and the substrate 12 (gate plate 14) by the high-voltage generator 50. Further, the differential pressure (difference from the atmospheric pressure) within the ink reservoir 21 was controlled by the syringe (to be negative) so that a meniscus of the catalyst ink was formed at the tip end of the conductive nozzle 22, which was confirmed using a CCD camera.

Subsequently, when a voltage of 3.0 kV or higher was applied by the high-voltage generator 50, a conical projection emerged from the catalyst ink at the tip end of the conductive nozzle to be in a state where a droplet with a size of a few or several microns was to drop therefrom. This state was defined as dipping mode.

Increasing the voltage applied by the high-voltage generator 50 caused a state where droplets (with a diameter of 5 μm or less) of the catalyst ink was to be discharged sequentially from the tip end of the meniscus. This state was defined as cone-jet mode.

Further increasing the voltage applied by the high-voltage generator caused a conical projection to emerge again from the tip end of the meniscus and also to move irregularly and discharge droplets. This state was defined as multi-jet mode.

The catalyst ink is desirably applied in the cone-jet mode. Discharged droplets of the catalyst ink were applied several times on the Nafion membrane and thereafter dried at 60 degrees C. in a thermostatic bath to prepare a cathode catalyst coated membrane (CCM, catalyst layer area of 4.4 cm$^2$) with a platinum support amount of approximately 0.048 to 0.054 mg-Pt/cm$^2$.

Figure 2:
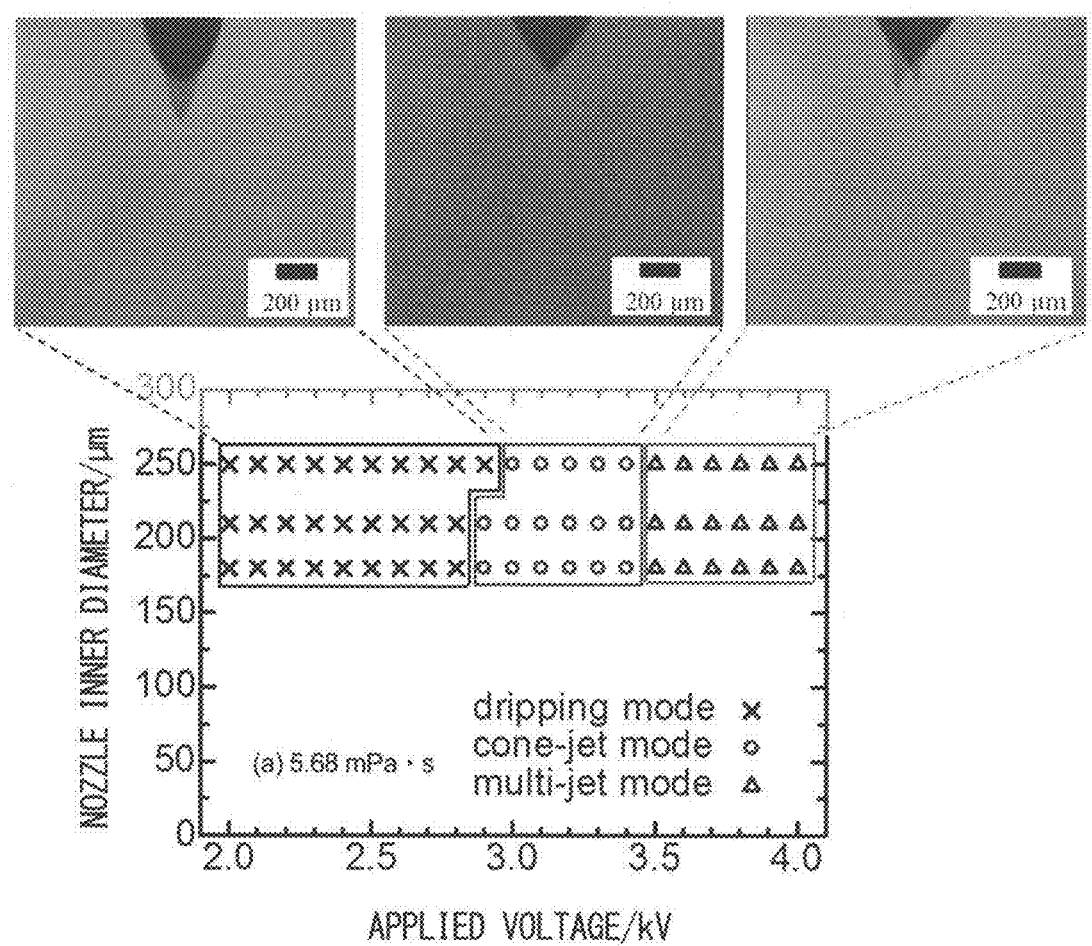
FIG. 2 is a graph with photos showing states of a Taylor cone emerging at a specific viscosity at the tip end of a conductive nozzle at varying applied voltages with the inner diameter of the conductive nozzle varied as a parameter.

FIG. 2 shows photos of the above-described dripping mode, cone-jet mode, and multi-jet mode at varying applied voltages and the range of the applied voltage in each mode with the inner diameter of the conductive nozzle varied (180, 210, 250 μm) as a parameter. The viscosity of the catalyst ink in this case was 5.68 mPa·s.

Figure 3:
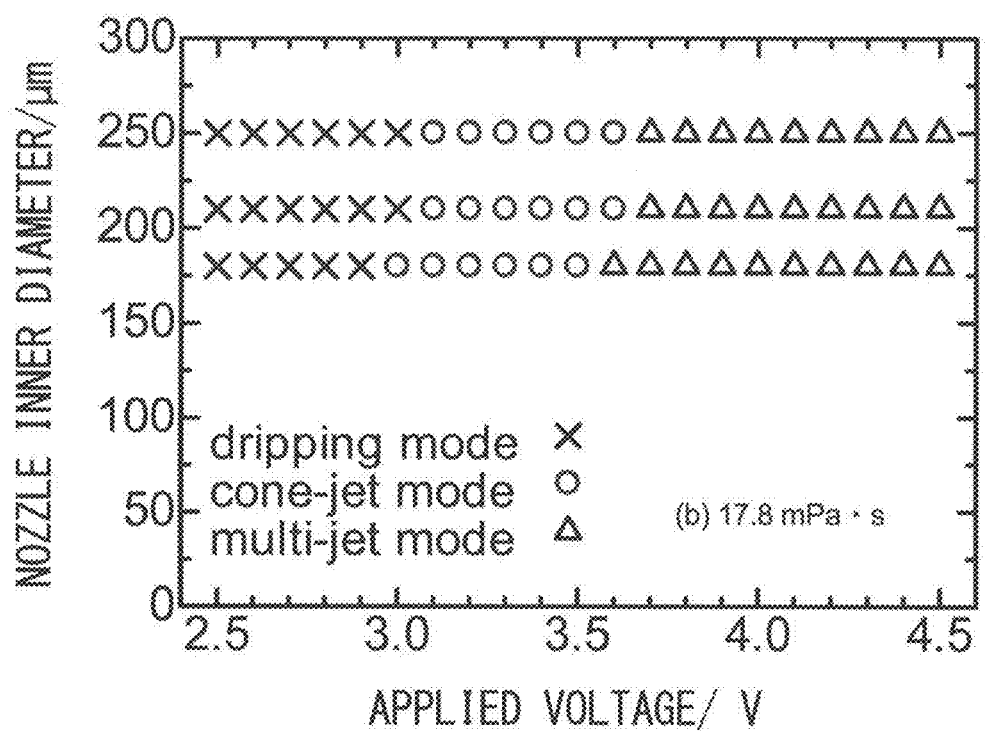
FIG. 3 is a graph showing modes of a Taylor cone emerging at a specific viscosity at the tip end of a conductive nozzle at varying applied voltages with the inner diameter of the conductive nozzle varied as a parameter.
Figure 4:
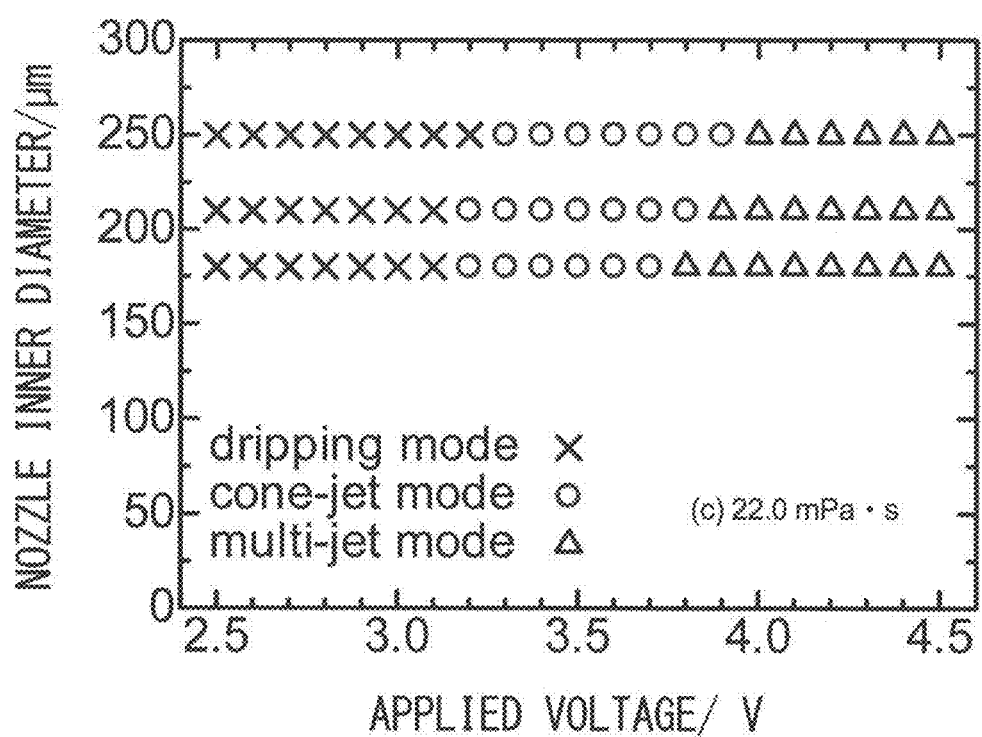
FIG. 4 is a graph showing modes of a Taylor cone emerging at a specific viscosity at the tip end of a conductive nozzle at varying applied voltages with the inner diameter of the conductive nozzle varied as a parameter.

FIGS. 3 and 4 are graphs showing results of the same experiment as shown in FIG. 2 with only the viscosity of the catalyst ink varied at different percentages of volatile organic compound or water. In both the figures, the vertical axis represents the inner diameter of the conductive nozzle, while the horizontal axis represents the applied voltage. FIG. 3 shows the case where the viscosity was 17.8 mPa·s, while FIG. 4 shows the case where the viscosity was 22.0 mPa·s.

Figure 5:
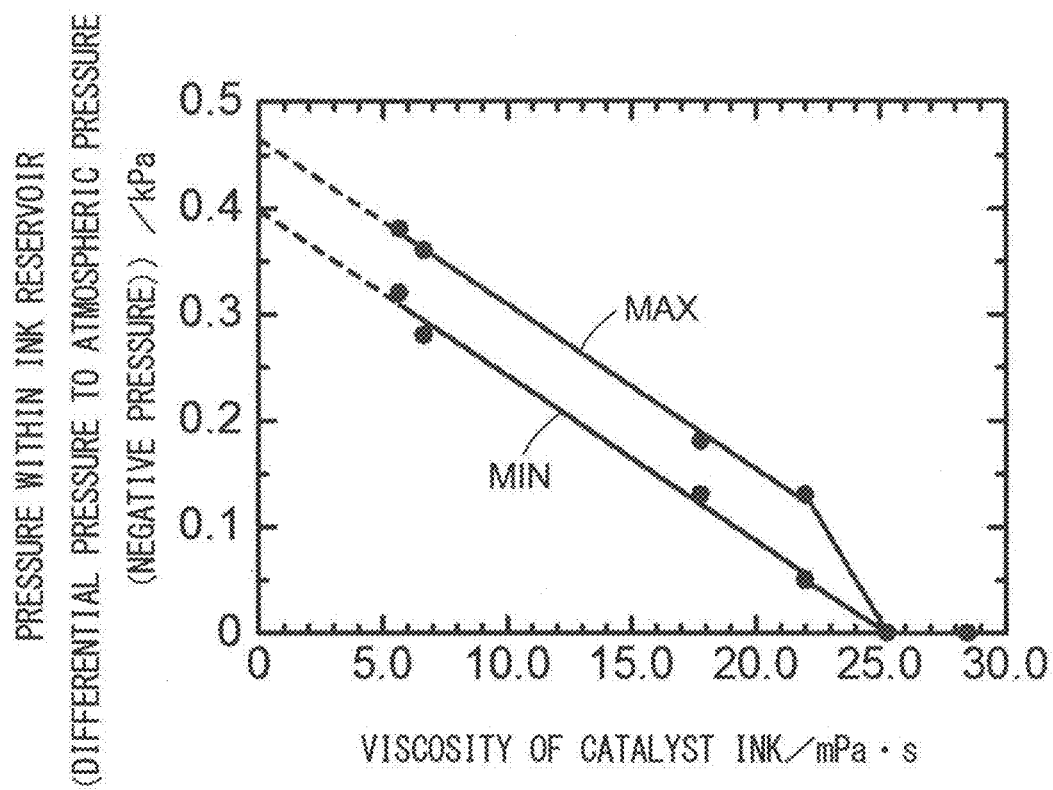
FIG. 5 is a graph showing a range of the pressure (differential pressure) within an ink reservoir at which an adequate Taylor cone occurs at varying viscosities of catalyst ink.

Since the catalyst ink is likely to drip off from the conductive nozzle at lower viscosity, it is necessary, for adequate electrospraying, to depressurize the ink reservoir 21 (for increased difference from the atmospheric pressure) to thereby prevent the catalyst ink from dripping gravitationally. The relationship obtained by the experiments between the viscosity of the catalyst ink and the pressure (represented as the differential pressure to the atmospheric pressure) within the ink reservoir (container) is shown in FIG. 5. In FIG. 5, the horizontal axis represents the viscosity (paste viscosity) of the catalyst ink, while the vertical axis represents the pressure (negative pressure) (represented as the differential pressure to the atmospheric pressure) within the ink reservoir. Points at the viscosity of 5.68 mPa·s derive from FIG. 2, points at the viscosity of 17.8 mPa·s derive from FIG. 3, and points at the viscosity of 22.0 mPa·s derive from FIG. 4. The points (lines) labeled MAX and MIN indicate a tolerance of the pressure within the ink reservoir. According to any pressure between MAX and MIN, adequate electrospraying in the cone-jet mode can occur depending on the applied voltage (which also has a tolerance). FIG. 5 shows experimental results in the case where the conductive nozzle had an inner diameter of 210 μm and 1 cm$^3$ of catalyst ink was put in the above-described ink reservoir with a volume of 10 cm$^3$.

In summary, the adjustment of the pressure (negative pressure) within the ink reservoir is affected by factors such as the gravity of the catalyst ink within the ink reservoir, the friction forces with the interior surface of the ink reservoir and the nozzle, and the viscosity of the catalyst ink, among which the viscosity of the catalyst ink has the greatest impact. With the inner diameter of the nozzle ranging from 180 to 250 μm, when the relationship between the negative pressure P (absolute value in kPa) within the ink reservoir and the viscosity of the catalyst ink (in mPa·s) resides within the range between the line MIN (expressed by the following equation (formula) (1)) and the line (broken curve) MAX (expressed by the following equations (formulae) (2), (3)) in FIG. 5, adequate electrospraying in the cone-jet mode can then occur.

$P \geq 0.407 - 0.0160 \times v$ (mPa·s), where $0 < v \leq 25$ mPa·s  Eq. (1)

$P \leq 0.476 - 0.0157 \times v$ (mPa·s), where $0 < v \leq 22$ mPa·s  Eq. (2)

$P \leq 1.17 - 0.0467 \times v$ (mPa·s), where $22$ mPa·s $< v \leq 25$ mPa·s  Eq. (3)

Accordingly, the negative pressure within the ink reservoir can be adjusted according to the viscosity of the catalyst ink, preferably within the range from 0 to 0.47 kPa (excluding 0 kPa), more preferably 0.05 to 0.4 kPa, and in the case the catalyst ink has lower viscosity, about 0.32 to 0.38 kPa, as exemplified above.

Since the pressure within the ink reservoir is thus made lower than the atmospheric pressure to prevent the catalyst ink from dripping, it is possible to increase the percentage of volatile organic compound and/or water contained in the catalyst ink (to reduce the viscosity). In the process of deposition of the fine mist by electrospraying on the polymer electrolyte membrane, the volatile organic compound and/or water are volatilized into the space to thereby remain a little or hardly remain in the deposited electrode catalyst layer, whereby it is possible to skip or reduce the time for the following drying step a well as increase the porosity (void ratio).

(7) Preparation of Comparison

By way of comparison, the conventional pulse-swirl-spray method (PSS) was also used to prepare Pt/Ta—SnO₂ CCM (with an area of 4.4 cm²). Under an adjusted condition of an atomization pressure of 0.15 MPa, an operation pressure of 0.4 MPa, a syringe pressure of 0.1 MPa, and a substrate temperature of 55 degrees C., the catalyst ink was applied several times on the Nafion membrane to achieve a platinum support amount of approximately 0.5 mg-Pt/cm² and thereafter dried at 60 degrees C. in a thermostatic bath to prepare a cathode CCM (with a catalyst layer area of 4.4 cm²) with a platinum support amount of approximately 0.048 to 0.054 mg-Pt/cm².

Figure 6:
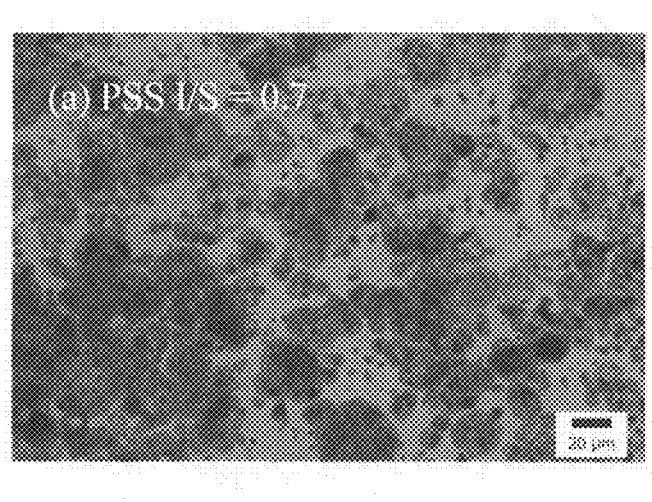
FIG. 6 shows photos of droplets when catalyst ink prepared by an electrospray (ES) method and a pulse-swirl-spray (PSS) method was caused to land on a polymer electrolyte membrane.
Figure 6:
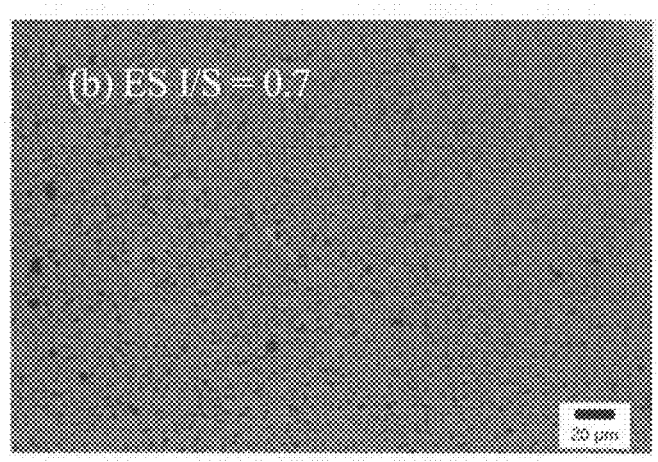
Figure 6:
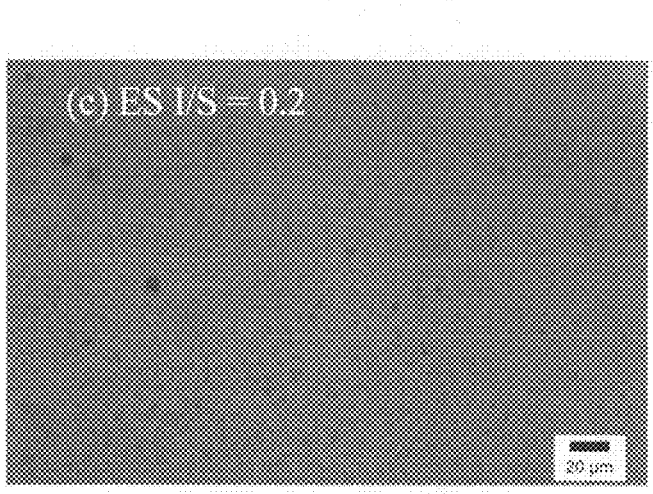

It is noted that the diameter (after landing in the substrate) of droplets of the catalyst ink prepared by the electrospray (ES) method and the pulse-swirl-spray (PSS) method was evaluated using a digital microscope (VHX-1000 from Keyence Corporation). In the electrospray (ES) method, the result is 4.40±1.39 μm (FIG. 6 (b)) for I/S=0.7 and 3.64±2.55 μm (FIG. 6 (c)) for I/S=0.2. In the pulse-swirl-spray (PSS) method, the result is 109.9±51.8 μm (FIG. 6 (a)) for I/S=0.7.

(8) Preparation of Anode Catalyst Layer

The pulse-swirl-spray (PSS) method was used to prepare an anode catalyst layer. Anode catalyst ink was applied to a gas diffusion layer (GDL, 25BCH from SGL Carbon Group) that uses carbon paper. Under an adjusted condition of an atomization pressure of 0.15 MPa, an operation pressure of 0.4 MPa, a syringe pressure of 0.1 MPa, and a substrate temperature of 55 degrees C., the anode catalyst ink was applied several times on the GDL to achieve a platinum support amount of approximately 0.5 mg-Pt/cm² and dried at 60 degrees C. in a thermostatic bath. As a result, an anode gas diffusion electrode (GDE; catalyst layer area of 4.4 cm²) was prepared with a platinum support amount of approximately 0.5 mg-Pt/cm². It will be appreciated that the anode catalyst layer can also be prepared by the electrospray (ES) method, as is the case with the cathode catalyst layer.

(9) Preparation of Membrane Electrode Assembly (MEA)

In the CCM, the GDE was layered on the surface of the polymer electrolyte membrane without the cathode catalyst layer, and further the gas diffusion layer (GDL) was overlaid on the cathode catalyst layer of the CCM to undergo hot press (at 140 degrees C. and a pressure of 10 kg·f/cm²) for 3 minutes. This resulted in a membrane electrode assembly (MEA) with the cathode catalyst layer and the anode catalyst layer layered on the Nafion membrane in an opposed manner.

(10) Structure of Electrode Catalyst Layer

The Pt support amount in the cathode catalyst layer and the anode catalyst layer was measured using an ICP-MS. As a result, the Pt support amount in the cathode catalyst layer of I/S=0.2 prepared by the electrospray (ES) method was 0.054 mg$_{Pt}$/cm², the Pt support amount in the cathode catalyst layer of I/S=0.7 was 0.048 mg$_{Pt}$/cm², the Pt support amount in the cathode catalyst layer of I/S=0.7 prepared by the pulse-swirl-spray (PSS) method was 0.048 mg$_{Pt}$/cm², and the Pt support amount in the anode catalyst layer of I/S=0.7 prepared by the pulse-swirl-spray (PSS) method was 0.50 mg$_{Pt}$/cm².

An ultrathin slice of each catalyst layer with a thickness of 20 nm was prepared by a focused ion beam method (FIB, FB-2200 from Hitachi High-Technologies Corporation) and Ga-ion-based scanning ion microscope (SIM) images were taken to obtain the cross-sectional thickness of each catalyst layer.

Figure 7:
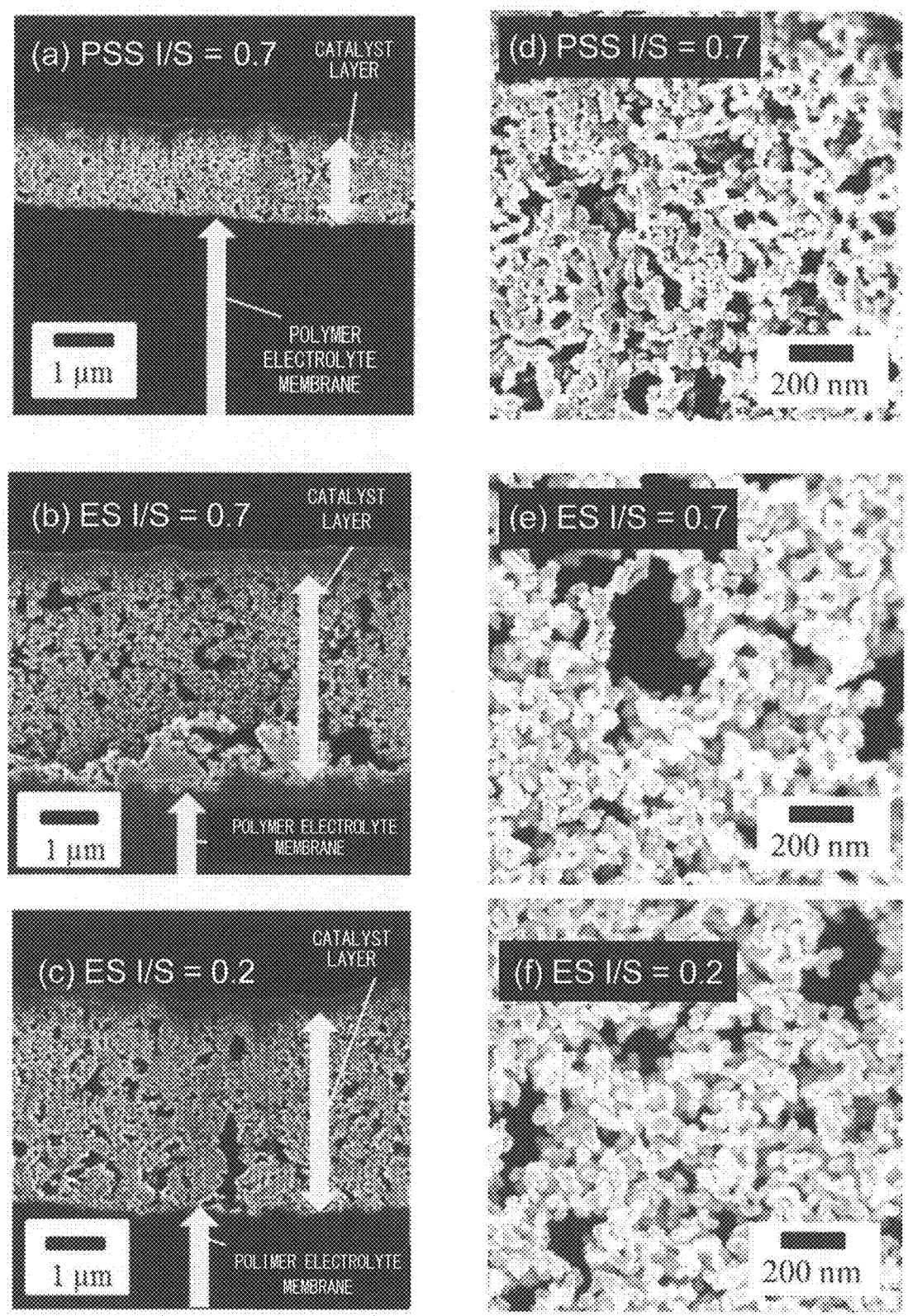
FIG. 7 shows cross-sectional SIM images and high-magnification images of cathode catalyst layers, illustrating comparison between cathode catalyst structures by the electrospray (ES) method and the pulse-swirl-spray (PSS) method.

With reference to FIG. 7, the thickness of the cathode catalyst layer (CL) of I/S=0.2 prepared by the electrospray (ES) method was 5.8±0.3 μm (FIG. 7 (c)), the thickness of the cathode catalyst layer (CL) of I/S=0.7 was 5.4±0.5 μm (FIG. 7 (b)), and the thickness of the cathode catalyst layer (CL) of I/S=0.7 prepared by the pulse-swirl-spray (PSS) method was 2.1±1.1 μm (FIG. 7 (a)).

The catalyst layers prepared by the FIB were observed by a scanning transmission electron microscope (STEM, HD-2700 from Hitachi High-Technologies Corporation) and low-magnification images of scanning secondary electrons (SEM) were taken to observe voids in the catalyst layers and binarized to obtain the percentage of voids of submicron order or higher in each catalyst layer. As a result, the cathode catalyst layer of I/S=0.2 had 0.36±0.026 and the cathode catalyst layer of I/S=0.7 had 0.33±0.023 prepared by the electrospray (ES) method, and the cathode catalyst layer of I/S=0.7 prepared by the pulse-swirl-spray (PSS) method had 0.21±0.024.

Similarly, the catalyst layers prepared by the FIB were observed by a scanning transmission electron microscope (STEM, HD-2700 from Hitachi High-Technologies Corporation) and high-magnification images of scanning secondary electrons (SEM) were taken to observe smaller voids in the catalyst layers and binarized to obtain the percentage of voids of lower than submicron order in each catalyst layer. As a result, the cathode catalyst layer of I/S=0.2 had 0.45±0.039 (FIG. 7 (f)) and the cathode catalyst layer of I/S=0.7 had 0.42±0.036 (FIG. 7 (e)) prepared by the electrospray (ES) method, and the cathode catalyst layer of I/S=0.7 prepared by the pulse-swirl-spray (PSS) method had 0.25±0.026 (FIG. 7 (d)) (see Table 1).

TABLE 1

Comparison of pore ratios calculated from binarized FIB-SEM images and FIB-SIM images

| Cell | Low-magnification images Total pore fraction | High-magnification images Total pore fraction | Three-dimensional images Porosity (%) |
|---|---|---|---|
| PSS I/S = 0.7 | 0.21 ± 0.024 | 0.25 ± 0.026 | 43.1 |
| ES I/S = 0.7 | 0.33 ± 0.023 | 0.42 ± 0.036 | 53.7 |
| ES I/S = 0.2 | 0.36 ± 0.026 | 0.45 ± 0.039 | — |

Figure 8:
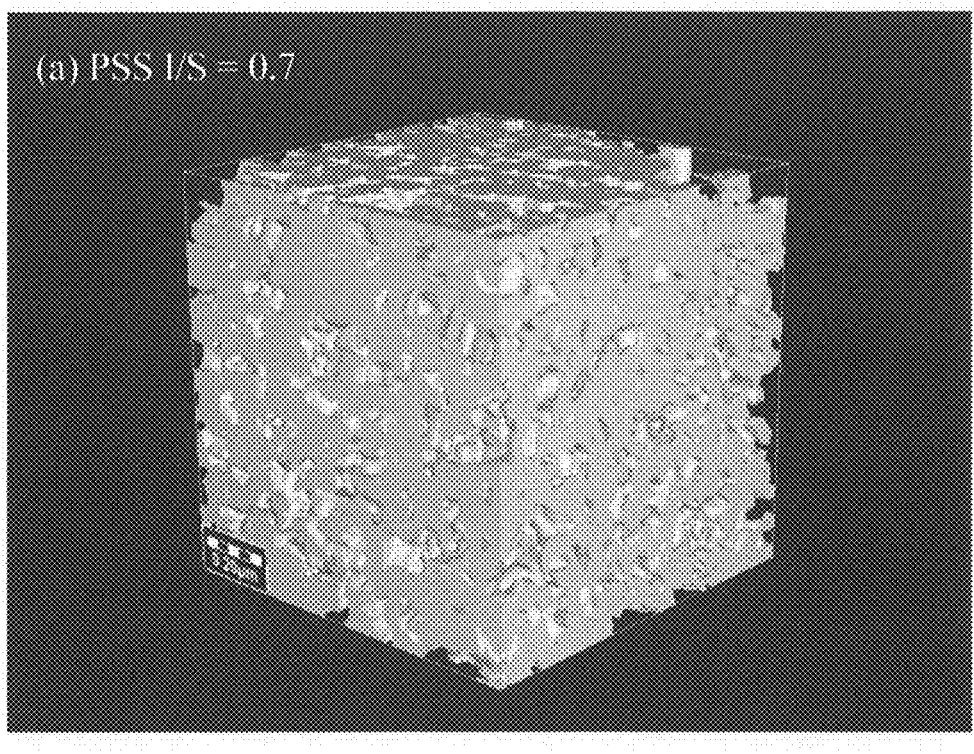
FIG. 8 shows FIB-SEM three-dimensional images, illustrating comparison between the electrospray (ES) method and the pulse-swirl-spray (PSS) method.
Figure 8:
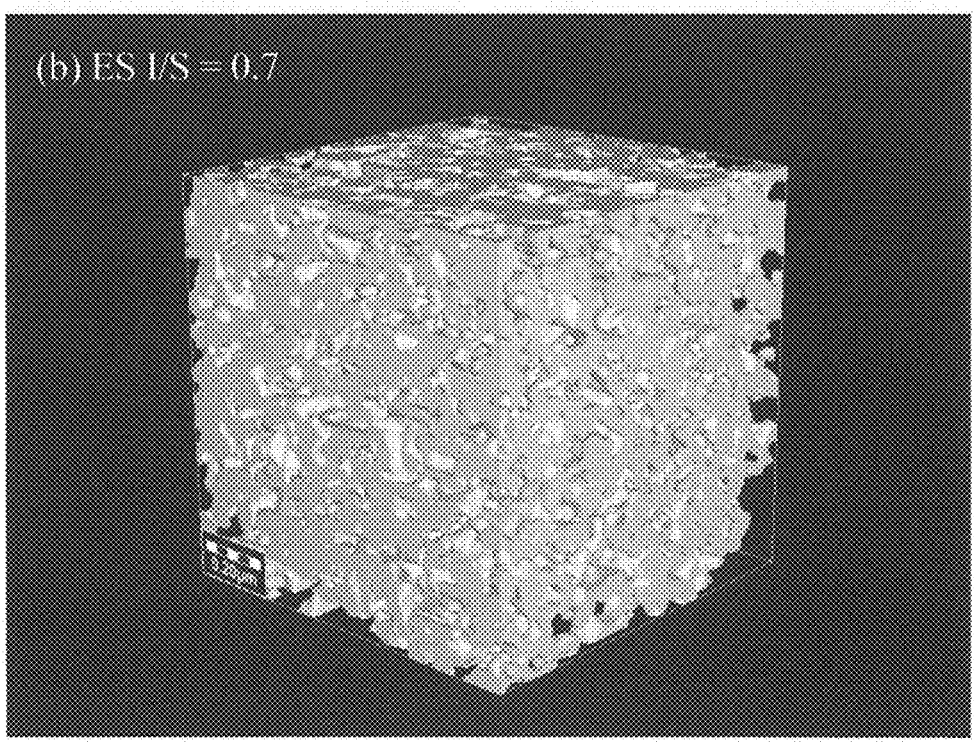
Figure 9:
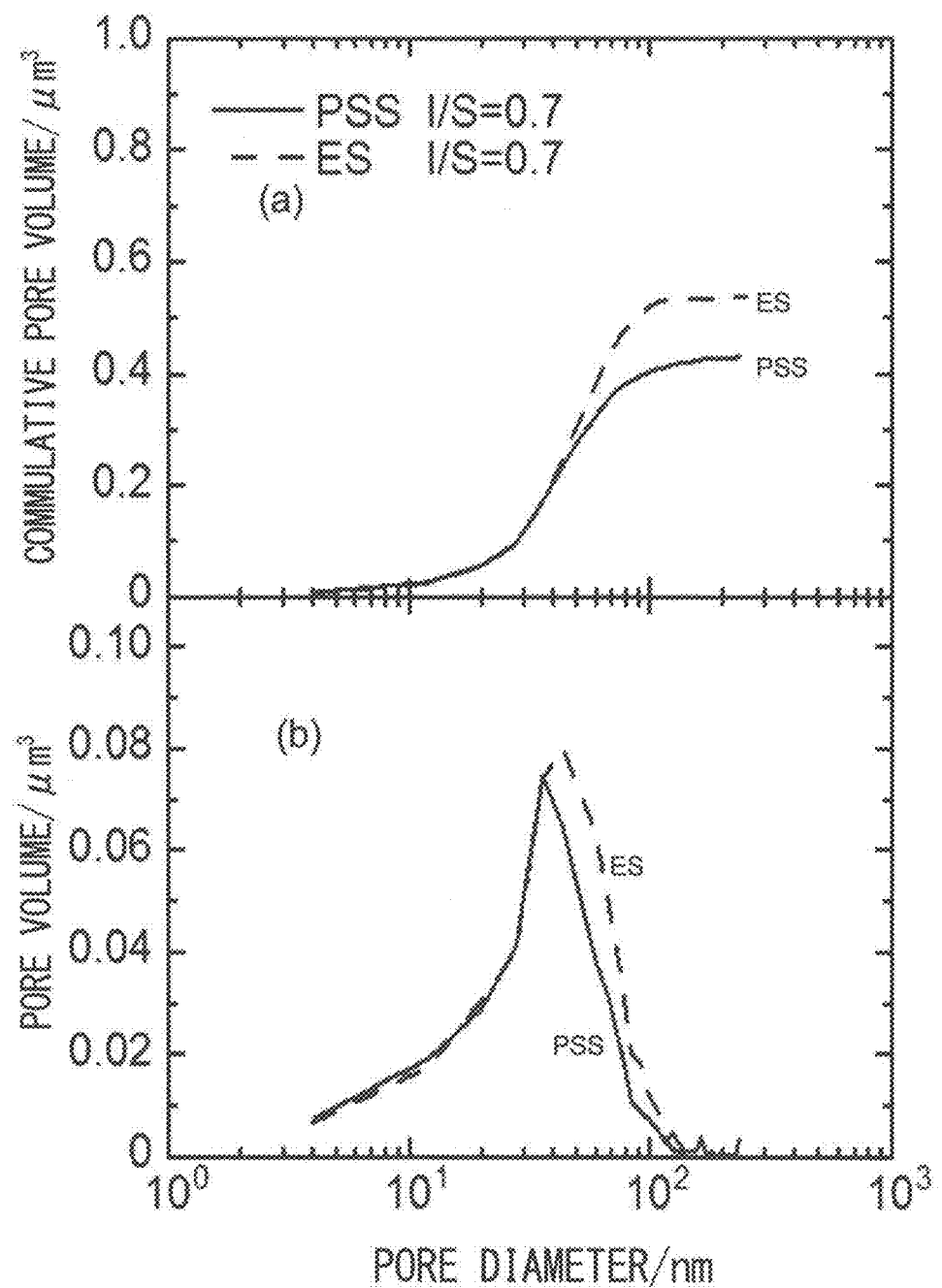
FIG. 9 is a graph for comparison between the electrospray (ES) method and the pulse-swirl-spray (PSS) method about the individual pore volume and the cumulative pore volume at varying pore diameters.

The void ratio of each cathode catalyst layer was also obtained in three-dimensional images of the catalyst layers by FIB-SEM (Helios NanoLab from Thermo Fisher Scientific Inc.; G3UC) (FIGS. 8 (a) and 8 (b)). As a result, the cathode catalyst layer of I/S=0.7 prepared by the electrospray (ES) method had 53.7% (FIG. 8 (b)) and the cathode catalyst layer of I/S=0.7 prepared by the pulse-swirl-spray (PSS) method had 43.1% (FIG. 8 (a)). Comparing the volumetric distribution of each void, it was confirmed that the cathode catalyst layer of I/S=0.7 contained more voids with a diameter of 50 nm or more. FIG. 9 shows the pore diameter distribution for the cumulative pore volume (FIG. 9 (a)) and the pore volume (FIG. 9 (b)) estimated from binarized FIB-SEM images. In FIG. 9, the horizontal axis represents the pore diameter, while the vertical axis represents the pore volume (b) and the cumulative pore volume (a).

Figure 10:
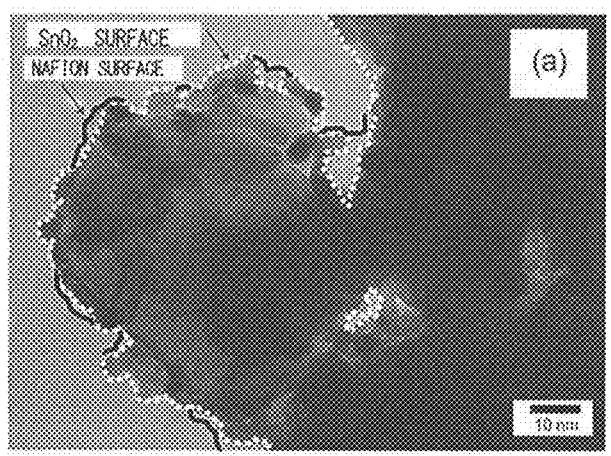
FIG. 10 shows transmission electron microscope images of the state of distribution of Nafion coating the catalyst surface, illustrating comparison between the electrospray (ES) method and the pulse-swirl-spray (PSS) method.
Figure 10:
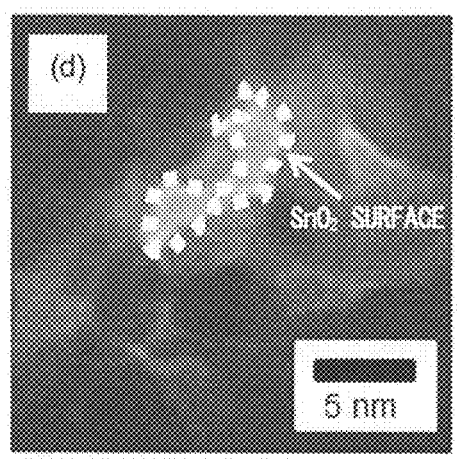
Figure 10:
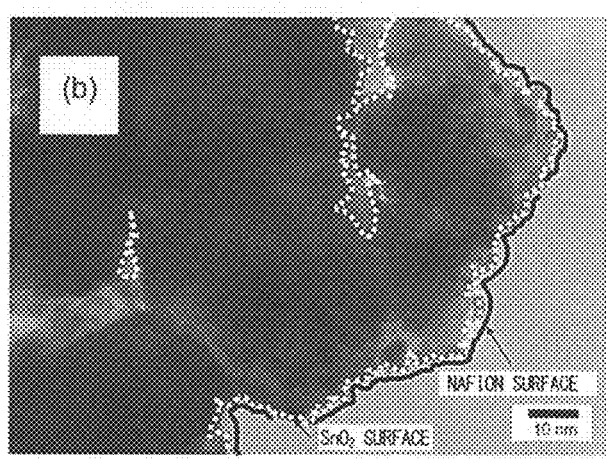
Figure 10:
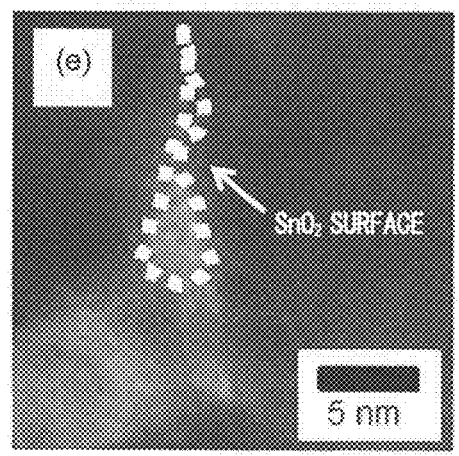
Figure 10:
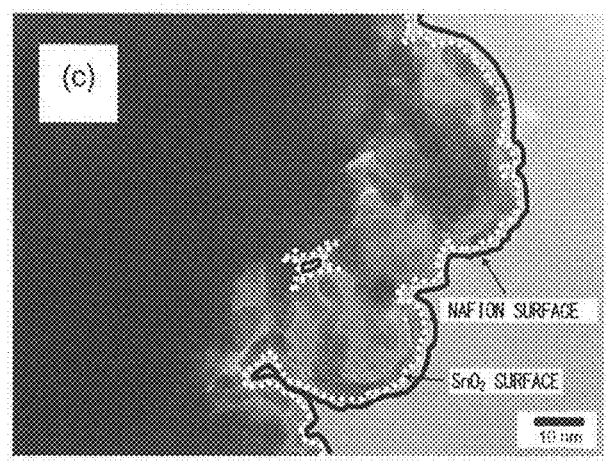
Figure 10:
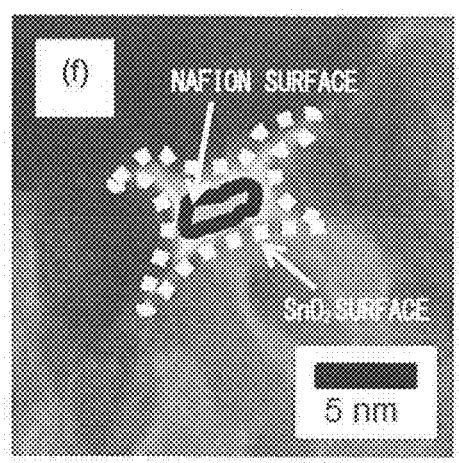

Transmission electron microscope images showing the distribution of Nafion covering the catalyst surface were taken using a low-acceleration transmission electron microscope (HT7700S from Hitachi High-Technologies Corporation). As a result, it was confirmed that in the cathode catalyst layer of I/S=0.7 prepared by the pulse-swirl-spray (PSS) method, most Nafion existed locally in isolation (FIG. 10 (a)), while in the cathode catalyst layer of I/S=0.2 and I/S=0.7 prepared by the electrospray (ES) method, most Nafion link continuously (FIGS. 10 (b) and 10 (c)). High-magnification transmission electron microscope images of the catalyst surface were further taken. As a result, it was confirmed that in the cathode catalyst layer of I/S=0.7 prepared by the pulse-swirl-spray (PSS) method and the cathode catalyst layer of I/S=0.7 prepared by the electrospray (ES) method, voids surrounded by Pt/Ta—$SnO_2$ were closed by Nafion (FIGS. 10 (d) and 10 (e)), while in the cathode catalyst layer of I/S=0.2 prepared by the electrospray (ES) method, voids surrounded by Pt/Ta—$SnO_2$ included Nafion uniformly coating the surface of Pt/Ta—$SnO_2$, while not closed by Nafion (FIG. 10 (f)). FIG. 10 shows the morphology of Nafion on Pt-supported Ta—$SnO_2$ ((a) PSS I/S=0.7, (b) ES I/S=0.7, (c) ES I/S=0.2) and their respective high-magnification images ((d) PSS I/S=0.7, (e) ES I/S=0.7, (f) ES I/S=0.2). The platinum support amount was 0.048 mg·$cm^{-2}$ (PSS I/S=0.7), 0.048 mg·$cm^{-2}$ (ES I/S=0.7), and 0.054 mg·$cm^{-2}$ (ES I/S=0.2).

(11) Evaluation of Power Generation

Figure 11:
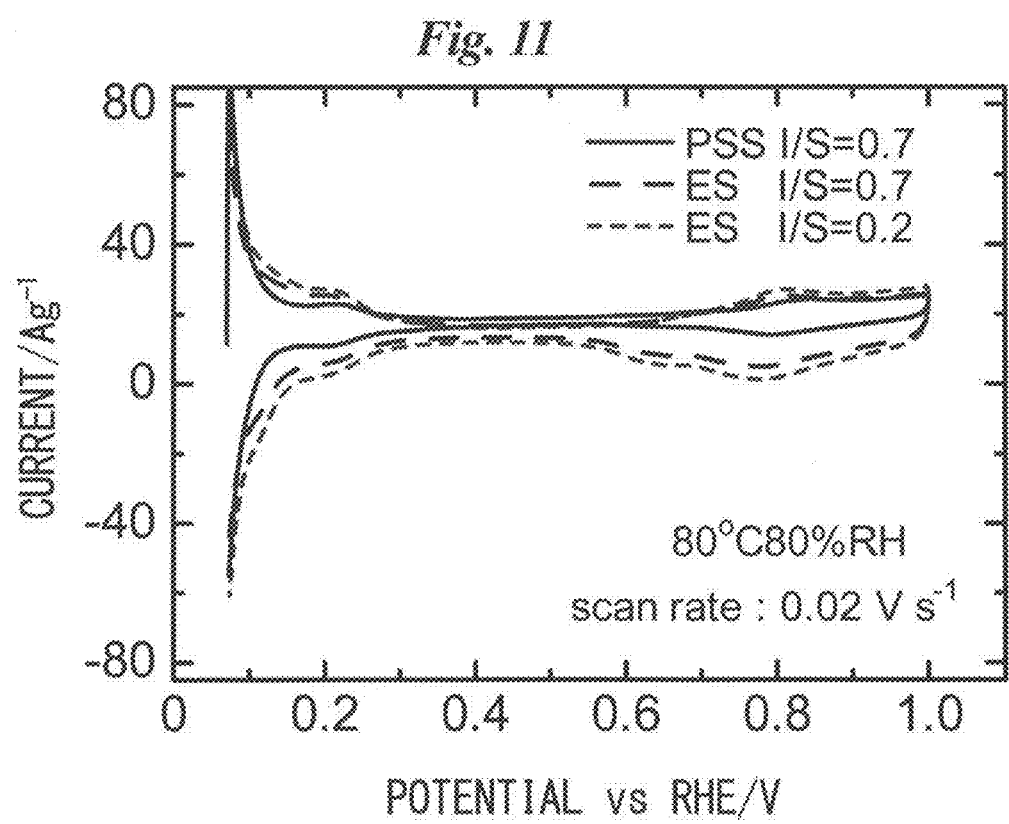
FIG. 11 is a cyclic voltammogram at 80 degrees C. and 80% RH.

Single cells using the respective MEAs above were assembled and put in a power generation evaluating device (FCE-1 from Panasonic Production Technology Co., Ltd.), with the anode supplied with hydrogen at a flow rate of 100 ml/min and the cathode with nitrogen at 150 ml/min, and maintained at 80 degrees C. and 80% RH. A potentiostat (from Metrohm AutoLab B.V.) was used to potentially sweep the cathode potential against the anode potential several cycles within the potential range from 0.075 V to 1.0 V at a sweep rate of 20 mV/sec until the voltammogram got stabilized. After maintaining the voltage at 0.08 V for 3 seconds, the supply of nitrogen was stopped to measure the voltammogram at 20 mV/sec. FIG. 11 is a cyclic voltammogram at 80 degrees C. and 80% RH. The electrochemically active surface are (ECA) of Pt was calculated by dividing the quantity of electricity ($Q_H$) of hydrogen adsorption wave measured under the atmospheric pressure by the energy contributing to adsorption of hydrogen atoms onto platinum (210 µC/$cm^2$), the geometrical surface area of the electrode (A), and the catalyst support amount ($M_{Pt}$). The results are summarized in Table 2. The usage of Pt ($U_{Pt}$) in Pt/Ta—$SnO_2$ was also obtained from the following equation (4). Here, $S_{Pt,TEM}$ means the geometrical surface area of Pt estimated from the average particle diameter that is obtained by TEM.

TABLE 2

Comparison of cell performance at 80 degrees C. and 80% RH in various cathode catalyst layers

| | ECA of Pt*[)]/ | Mass activity at 0.85 V*[)]/$Ag^{-1}$ Cathode gas type | | Mass activity at 0.65 V/$Ag^{-1}$ Cathode air pressure | | |
|---|---|---|---|---|---|---|
| | $M^2g^{-1}$ | Oxygen | Air | 100 kPa | 150 kPa | 200 kPa |
| PSS I/S = 0.7 | 43.3 | 129 | 18.9 | 411 | 671 | 814 |
| ES I/S = 0.7 | 47.2 | 287 | 42.0 | 3840 | 5340 | 6890 |
| ES I/S = 0.2 | 56.9 | 416 | 53.9 | 6830 | 7890 | 9450 |

*[)]Measured under the atmospheric pressure $$U_{Pt}=(ECA/S_{Pt,TEM})\times 100 \qquad \text{Eq. (4)}$$

From above, the cathode catalyst layer of I/S=0.7 prepared by the electrospray (ES) method has 85%, the cathode catalyst layer of I/S=0.2 prepared by the electrospray (ES) method has 103%, and the cathode catalyst layer of I/S=0.7 prepared by the pulse-swirl-spray (PSS) method has 78%. This reveals that catalyst layers synthesized by the electrospray (ES) method have higher usage of Pt than synthesized by the pulse-swirl-spray (PSS) method. This supports the result of observations of the distribution of Nafion covering the catalyst surface using the low-acceleration transmission electron microscope (HT7700S from Hitachi High-Technologies Corporation) (FIG. 10). This reveals that catalyst layers synthesized by the electrospray (ES) method exhibit the advantageous effect of coating the heterogeneous catalyst with the polymer electrolyte binder more evenly than synthesized by the pulse-swirl-spray (PSS) method. There is another advantageous effect that droplets of the catalyst ink by the electrospray (ES) method have a smaller diameter and thereby, after application of the catalyst ink, the volatile organic compound is volatilized earlier than by the pulse-swirl-spray (PSS) method. It may consequently be contemplated that the polymer electrolyte binder in high dispersion into the volatile organic compound is more likely to coat the heterogeneous catalyst and also have higher usage of Pt by the electrospray (ES) method than by the pulse-swirl-spray (PSS) method. It may also be contemplated that this effect derives from the difference in the drying step and thus can be exhibited by the homogeneous catalyst.

Figure 12:
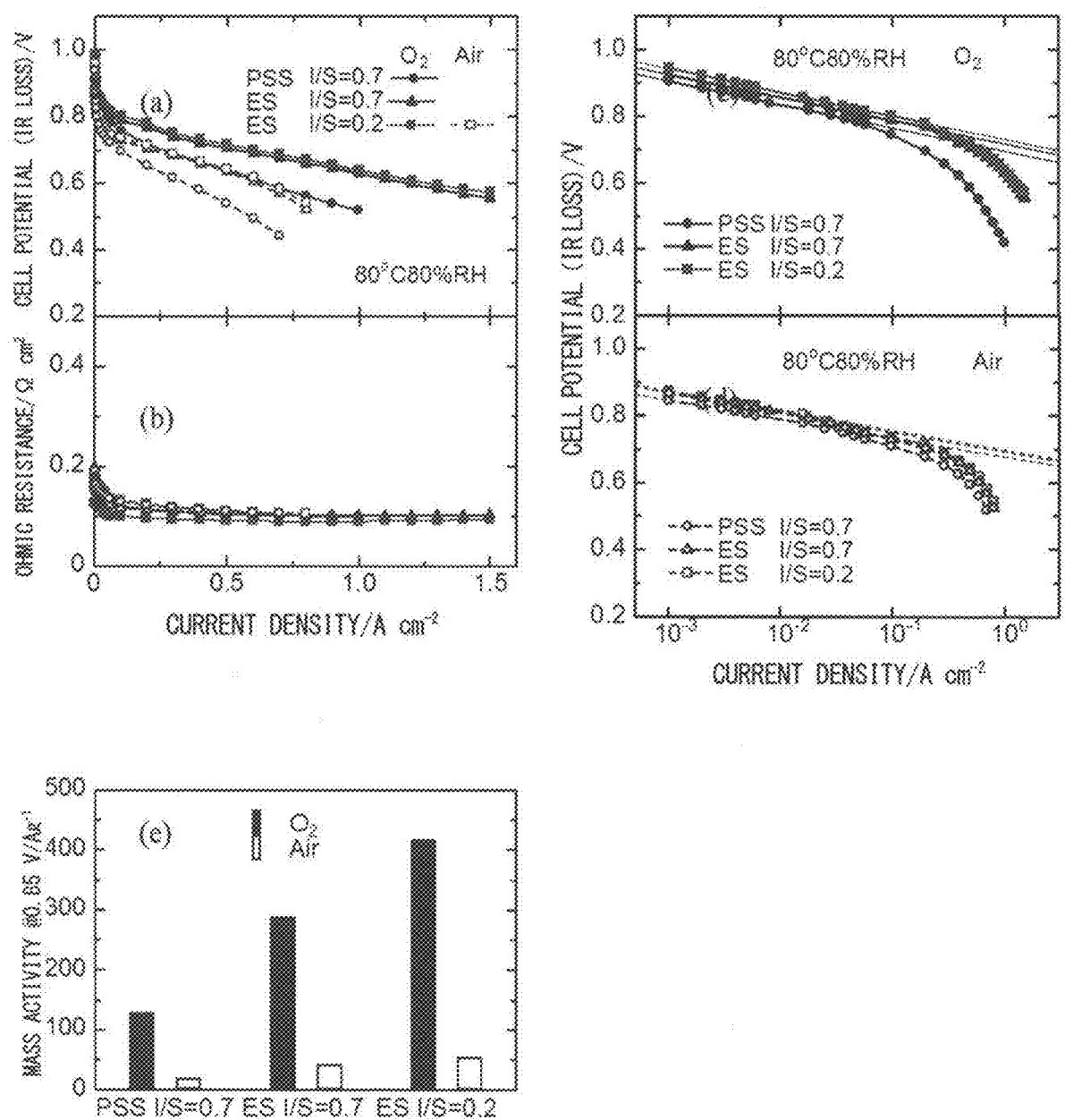
FIG. 12 is a graph showing results of power generation evaluation.

An electronic loading device (PLZ-664WA from Kikusui Electronics Corporation) was used to measure the current-voltage (I-E) relationship. The anode was supplied with hydrogen (at a flow rate of 100 ml/min and the atmospheric pressure) and the cathode was supplied with oxygen or air at 100 ml/min, the atmospheric pressure, and a differential pressure of 150 kPa or 200 kPa. The temperature and the humidity were maintained at 80 degrees C. and 80% RH. The cell resistance was measured using a milliohm meter (Model 356E from Tsuruga Electric Corporation). Comparing the cell performance of the single cells employing the respective cathode catalyst layers (FIGS. 12 (a) and 12 (b)), the cell resistances are the same for the respective cases where the cathode was supplied with oxygen and air and the Tafel slopes are also the same for the respective catalyst layers (FIGS. 12 (c) and 12 (d)). Comparing the mass activity at 0.85 V between I/S=0.7 prepared by the electrospray (ES) method and I/S=0.7 prepared by the pulse-swirl-spray (PSS) method, the cell performance is higher for the electrospray (ES) method. Also, since the mass activity at 0.85 V when prepared by the electrospray (ES) method is higher for I/S=0.2 than for I/S=0.7, it may be contemplated that the increase in the effective usage in the electrospray (ES) method is due to the increase in the mass activity (FIG. 12 (e)). FIG. 12 (a) shows an IR polarization curve, FIG. 12 (b) shows an ohm resistance for oxygen or air/hydrogen at 80 degrees C., 80% RH, and the atmospheric pressure, FIG. 12 (c) shows a Tafel plot when oxygen is used, FIG. 12 (d) shows a Tafel plot when air is used, and FIG. 12 (e) shows mass activity at 0.85 V (without IR loss) for oxygen or air/hydrogen. The platinum support amount was 0.048 mg·cm$^{-2}$ (pulse-swirl-spray (PSS) I/S=0.7), 0.048 mg·cm$^{-2}$ (electrospray (ES) I/S=0.7), and 0.054 mg·cm$^{-2}$ (electrospray (ES) I/S=0.2).

Figure 13:
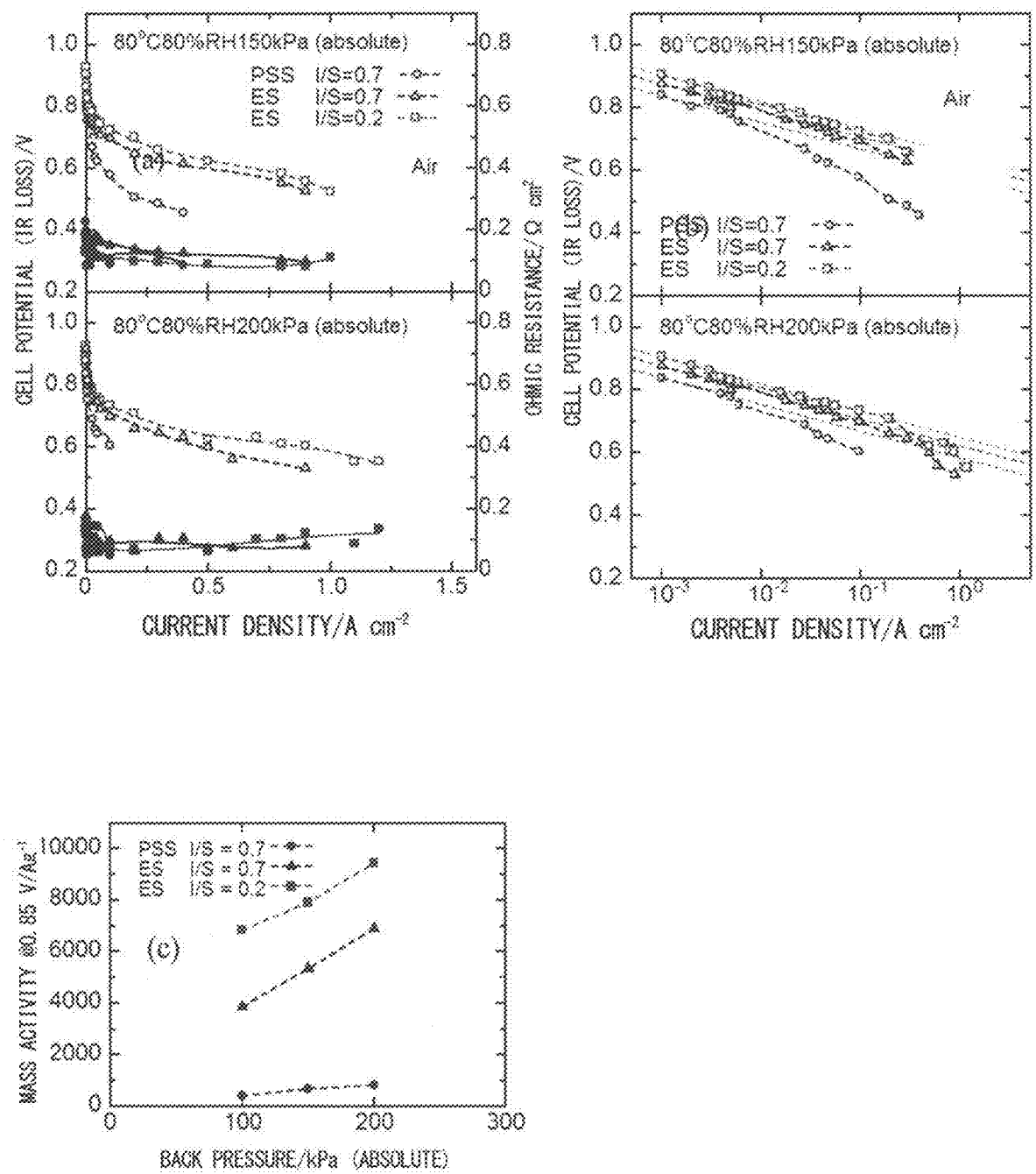
FIG. 13 is a graph showing results of power generation evaluation.

As a result of further measurements at varying cathode differential pressures (FIGS. 13 (a), 13 (b)), it was confirmed that the mass activity of cells employing the catalyst layers of I/S=0.2 and 0.7 prepared by the electrospray (ES) method increased eight to ten times higher than I/S=0.7 prepared by the pulse-swirl-spray (PSS) method (FIG. 13 (c) and Table 2). It may consequently be contemplated that catalyst layers prepared by the electrospray (ES) method have higher void ratio and a more highly developed network of the polymer electrolyte binder than prepared by the pulse-swirl-spray (PSS) method. FIG. 13 (a) shows an IR polarization curve and an ohm resistance for air/hydrogen at a backpressure of 150 kPa (absolute value) or 200 kPa (absolute value), 80 degrees C. and 80% RH, FIG. 13 (b) shows a Tafel plot for air/hydrogen at a backpressure of 150 kPa (absolute value) or 200 kPa (absolute value), 80 degrees C. and 80% RH, and FIG. 13 (c) shows mass activity at 0.85 V (without IR loss) for oxygen or air/hydrogen. The platinum support amount was 0.048 mg·cm$^{-2}$ (pulse-swirl-spray (PSS) I/S=0.7), 0.048 mg·cm$^{-2}$ (electrospray (ES) I/S=0.7), and 0.054 mg·cm$^{-2}$ (ES I/S=0.2).

Comparing the cell performance when using catalyst layers prepared by the above-described electrospray (ES) method and the electrospinning method (Table 3), this example shows the highest performance and proves that the electrospray (ES) method that newly employs negative pressure control has a beneficial effect on catalyst layer formation and performance improvement of fuel cells.

The following articles are referenced in Table 3.

A. M. Chaparro et al.
A. M. Chaparro, P. Ferreira-Aparicio, M. A. Folgado, E. Brightman, G. Hinds "Study of superhydrophobic electrosprayed catalyst layers using a localized reference electrode technique" Journal of Power Sources, Volume 325, 1 Sep. 2016, Pages 609-619

P. Pintauro et al.
M. Brodt, T. Han, N. Dale, E. Niangar, R. Wycisk, and P. Pintauro, "Fabrication, In-Situ Performance, and Durability of Nanofiber Fuel Cell Electrodes" J. Electrochem. Soc., 162(1), F84-F91 (2015).

TABLE 3

Comparison of cell performance at 80 degrees C. using various cathode catalyst layers

| | Support material | Pt support amount/ mg · cm$^{-2}$ | Electrode size/ cm$^2$ | Cathode gas type | Cathode gas pressure/kPa | ECA**/m$^2$g$^{-1}$ | Cathode gas relative humidity (%) | Mass activity at 0.85 V/Ag$^{-1}$ | Mass activity at 0.65 V/Ag$^{-1}$ |
|---|---|---|---|---|---|---|---|---|---|
| Synthesized by the ES method of this example | Ta—SnO$_2$ | 0.054 | 4.4 | Air | 100 | 57 | 80 | 54 | 2700 |
| | Ta—SnO$_2$ | 0.054 | 4.4 | Air | 200 | 58 | 80 | 65 | 9500 |
| | Graphited HSAC* | 0.056 | 29 | Air | 100 | 50 | 80 | 51 | 3600 |
| Synthesized by the ES method of A. M. Chaparro et al. | Advanced HSAC* | 0.25 | 49 | Air | 200 | 43 | 100 | 20 | 2700 |
| Synthesized by the electrospinning method of P. Pintauro et al. | HSAC* | 0.10 | 5.0 | Air | 100 | — | 100 | 40 | 7100 |
| | Vulcan | 0.10 | 25 | Air | 200 | 64 | 100 | 71 | 9000 |

*HSAC: high surface area carbon
**ECA: electro chemical surface area

Evaluated under the conditions in the respective research papers.

Abbreviations List

Ta—SnO$_2$: Ta-doped SnO$_2$ (tantalum-doped tin oxide)
I/S=0.2: catalyst ink with Nafion mixed at a ratio of 0.2 to the volume of Pt/Ta—SnO$_2$
I/S=0.7: catalyst ink with Nafion mixed at a ratio of 0.7 to the volume of Pt/Ta—SnO$_2$
CCM: catalyst coated membrane
GDL: gas diffusion layer
GDE: gas diffusion electrode
MEA: membrane electrode assembly
CL: catalyst layer
RHE: reversible hydrogen electrode
ECA: electrochemically active surface area
BET: Brunauer-Emmett-Teller (BET) adsorption method
ES method: electrospray (deposition) method
PSS method: pulse-swirl-spray method
FIB: focused ion beam method
XRD: X-ray diffractometer
TEM: transmission electron microscope
ICP-MS: inductively coupled plasma mass spectrometer SIM: scanning ion microscope
STEM: scanning transmission electron microscope

REFERENCE SIGNS LIST 1 apparatus for forming an electrode catalyst layer by an electrospray (ES) (deposition) method
10 X-direction table (scanning mechanism)
11 XY table (scanning mechanism)
12 substrate (membrane holding member) (medium holding member)
13 polymer electrolyte membrane (film-like medium, film-like base)
14 gate plate
15 control hole (through hole)
21 ink reservoir container
22 conductive nozzle
24 pressure gauge (device, means)
25 pressure adjuster (device, means) (syringe)
30, 40 post (retaining mechanism)
31, 41 liftable body (retaining mechanism)
32 clamping tool (grasping tool, holding tool) (retaining means) (retaining mechanism)
33, 43 threaded shaft (lifting and lowering device)
42 arm
50 high-voltage generator

The invention claimed is:

1. A method for forming an electrode catalyst layer by an electro spray method, comprising:
putting catalyst ink containing a mixture of at least electrode catalyst, polymer electrolyte binder and volatile organic compound and/or water within an insulative container with a space remaining inside of the container, and air-tightly sealing the container; and with the space inside of the air-tightly sealed container being conditioned to have a negative pressure of a level at which the catalyst ink cannot drip off from a conductive nozzle in communication with an interior of the container, applying an electrospray voltage to the nozzle or to the catalyst ink within the container to cause electro spray of the catalyst ink through the tip end of the nozzle and thereby to form an electrode catalyst layer.

2. A method for forming an electrode catalyst layer by an electrospray method, including putting catalyst ink within a container having a nozzle in communication with the interior of the container and applying an electrospray voltage to the catalyst ink to cause electrospray of the catalyst ink through the tip end of the nozzle and thereby to form an electrode catalyst layer, the method comprising:
preparing catalyst ink containing a mixture of at least electrode catalyst, polymer electrolyte binder and volatile organic compound and/or water;
putting the catalyst ink within the container with a space remaining inside thereof, and air-tightly sealing the container; and
electrospraying with the space inside of the air-tightly sealed container being conditioned to have a negative pressure of a level at which the catalyst ink cannot drip off from the nozzle.

3. The method for forming an electrode catalyst layer by an electrospray method according to claim 1, wherein the negative pressure within the space inside of the air-tightly sealed container is adjusted according to the viscosity of the catalyst ink.

4. The method for forming an electrode catalyst layer by an electrospray method according to claim 1, wherein the negative pressure within the space inside of the air-tightly sealed container is within the range from 0 to 0.47 kPa (excluding 0 kPa).

5. The method for forming an electrode catalyst layer by an electrospray method according to claim 1, wherein the negative pressure within the space inside of the air-tightly sealed container is within the range from 0.05 to 0.4 kPa.

6. The method for forming an electrode catalyst layer by an electrospray method according to claim 1, wherein the nozzle is provided in a lower portion of the container and the tip end of the nozzle points downward.

7. The method for forming an electrode catalyst layer by an electrospray method according to claim 6, wherein a film-like medium to be formed with the electrode catalyst layer is arranged below the nozzle.

8. The method for forming an electrode catalyst layer by an electrospray method according to claim 7, wherein a substrate is provided on which the film-like medium is placed.

9. The method for forming an electrode catalyst layer by an electrospray method according to claim 1, wherein the nozzle is supported in a manner movable up and down and fixable in a desired position.

10. The method for forming an electrode catalyst layer by an electrospray method according to claim 1, wherein the nozzle and the film-like medium to be formed with the electrode catalyst layer are scanned relatively and two-dimensionally within at least a range of the area of the film-like medium.

11. The method for forming an electrode catalyst layer by an electrospray method according to claim 1, wherein the pressure within the space inside of the container is measured.

12. The method for forming an electrode catalyst layer by an electrospray method according to claim 1, wherein a conductive gate plate with a control hole opened with the center on an extension of the nozzle is arranged between the nozzle and the film-like medium to be formed with the electrode catalyst layer.

13. The method for forming an electrode catalyst layer by an electrospray method according to claim 12, wherein the nozzle and the gate plate are moved together with the arrangement relationship therebetween maintained.

14. An apparatus for forming an electrode catalyst layer by an electrospray method comprising:
a retaining mechanism for retaining an air-tightly sealable container within which catalyst ink is put with a space filled with gas remaining inside thereof and a nozzle in communication with a lower portion of an interior of the container;
a medium holding member arranged on an extension of the nozzle retained by the retaining mechanism and holding on the surface thereof a film-like medium to be formed with an electrode catalyst layer;
a pressure measuring device for measuring the pressure within the space inside of the container retained by the retaining mechanism;
a pressure adjusting device for conditioning the space inside of the container retained by the retaining mechanism to have a negative pressure; and
a voltage-adjustable high-voltage generator for applying an electrospray voltage between the catalyst ink within the container or the nozzle and the film-like medium or the medium holding member.

15. The apparatus for forming an electrode catalyst layer by an electrospray method according to claim 14, wherein a conductive gate plate with a control hole opened with the center on an extension of the nozzle is arranged between the nozzle and the medium holding member.

16. The apparatus for forming an electrode catalyst layer by an electrospray method according to claim 14, wherein the retaining mechanism retains the container in a positionable manner.

17. The apparatus for forming an electrode catalyst layer by an electrospray method according to claim 15, further comprising a gate plate retaining mechanism for retaining the gate plate in a positionable manner.

18. The apparatus for forming an electrode catalyst layer by an electrospray method according to claim 14, further comprising a scanning mechanism for translating the retaining mechanism relatively to the medium holding member.

19. The apparatus for forming an electrode catalyst layer by an electrospray method according to claim 17, further comprising a scanning mechanism for translating the retaining mechanism and the gate plate retaining mechanism relatively to the medium holding member.

20. The apparatus for forming an electrode catalyst layer by an electrospray method according to claim 14, wherein the negative pressure within the space inside of the airtightly sealed container is adjusted according to a viscosity of the catalyst ink.

\* \* \* \* \*